(12) United States Patent
Chen et al.

(10) Patent No.: US 12,170,228 B2
(45) Date of Patent: Dec. 17, 2024

(54) SEMICONDUCTOR DEVICE AND METHODS OF MANUFACTURING

(71) Applicant: Taiwan Semiconductor Manufacturing Co., Ltd., Hsinchu (TW)

(72) Inventors: Hung-Yao Chen, Hsinchu (TW); Pin-Chu Liang, Hsinchu (TW); Hsueh-Chang Sung, Zhubei (TW); Pei-Ren Jeng, Chu-Bei (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/366,864

(22) Filed: Aug. 8, 2023

(65) Prior Publication Data

US 2023/0402326 A1 Dec. 14, 2023

Related U.S. Application Data

(62) Division of application No. 17/462,818, filed on Aug. 31, 2021, now Pat. No. 11,948,840.

(51) Int. Cl.
| | |
|---|---|
| *H01L 21/82* | (2006.01) |
| *H01L 21/8234* | (2006.01) |
| *H01L 21/8238* | (2006.01) |
| *H01L 27/088* | (2006.01) |
| *H01L 27/092* | (2006.01) |

(52) U.S. Cl.
CPC ........... *H01L 21/823431* (2013.01); *H01L 21/823821* (2013.01); *H01L 27/0886* (2013.01); *H01L 27/0924* (2013.01)

(58) Field of Classification Search
None
See application file for complete search history.

(56) References Cited

U.S. PATENT DOCUMENTS

| | | | |
|---|---|---|---|
| 8,497,177 B1 * | 7/2013 | Chang | H01L 29/66795 |
| | | | 438/283 |
| 8,946,792 B2 | 2/2015 | Cheng et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |

(Continued)

FOREIGN PATENT DOCUMENTS

| | | |
|---|---|---|
| TW | 201428970 A | 7/2014 |
| TW | 201735352 A | 10/2017 |
| TW | 201944598 A | 11/2019 |

*Primary Examiner* — Benjamin P Sandvik
(74) *Attorney, Agent, or Firm* — Slater Matsil, LLP

(57) ABSTRACT

In an embodiment, a method includes forming a first fin and a second fin within an insulation material over a substrate, the first fin and the second fin includes different materials, the insulation material being interposed between the first fin and the second fin, the first fin having a first width and the second fin having a second width; forming a first capping layer over the first fin; and forming a second capping layer over the second fin, the first capping layer having a first thickness, the second capping layer having a second thickness different from the first thickness.

20 Claims, 31 Drawing Sheets

(56) References Cited

U.S. PATENT DOCUMENTS

| | | | |
|---|---|---|---|
| 9,548,303 | B2 | 1/2017 | Lee et al. |
| 9,564,489 | B2 | 2/2017 | Yeo et al. |
| 9,576,814 | B2 | 2/2017 | Wu et al. |
| 9,601,342 | B2 | 3/2017 | Lee et al. |
| 9,608,116 | B2 | 3/2017 | Ching et al. |
| 9,634,084 | B1 * | 4/2017 | Sheraw ............. H01L 21/02513 |
| 10,242,929 | B1 | 3/2019 | Lysacek et al. |
| 10,522,546 | B2 | 12/2019 | Liaw |
| 10,580,864 | B2 | 3/2020 | Tung |
| 2015/0279971 | A1 | 10/2015 | Xie et al. |
| 2015/0380528 | A1 | 12/2015 | Lee et al. |
| 2016/0049468 | A1 | 2/2016 | Wu et al. |
| 2016/0064225 | A1 * | 3/2016 | Kim ...................... H01L 29/513 |
| | | | 438/591 |
| 2016/0240652 | A1 | 8/2016 | Ching et al. |
| 2016/0380056 | A1 | 12/2016 | Yeo et al. |
| 2018/0342509 | A1 | 11/2018 | Ching et al. |
| 2020/0091007 | A1 | 3/2020 | Lee et al. |
| 2021/0257462 | A1 * | 8/2021 | Lu ......................... H01L 29/785 |

\* cited by examiner

SEMICONDUCTOR DEVICE AND METHODS OF MANUFACTURING

PRIORITY CLAIM AND CROSS-REFERENCE

This application is a divisional of U.S. patent application Ser. No. 17/462,818, filed on Aug. 31, 2021, entitled "Semiconductor Device and Methods of Manufacturing," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
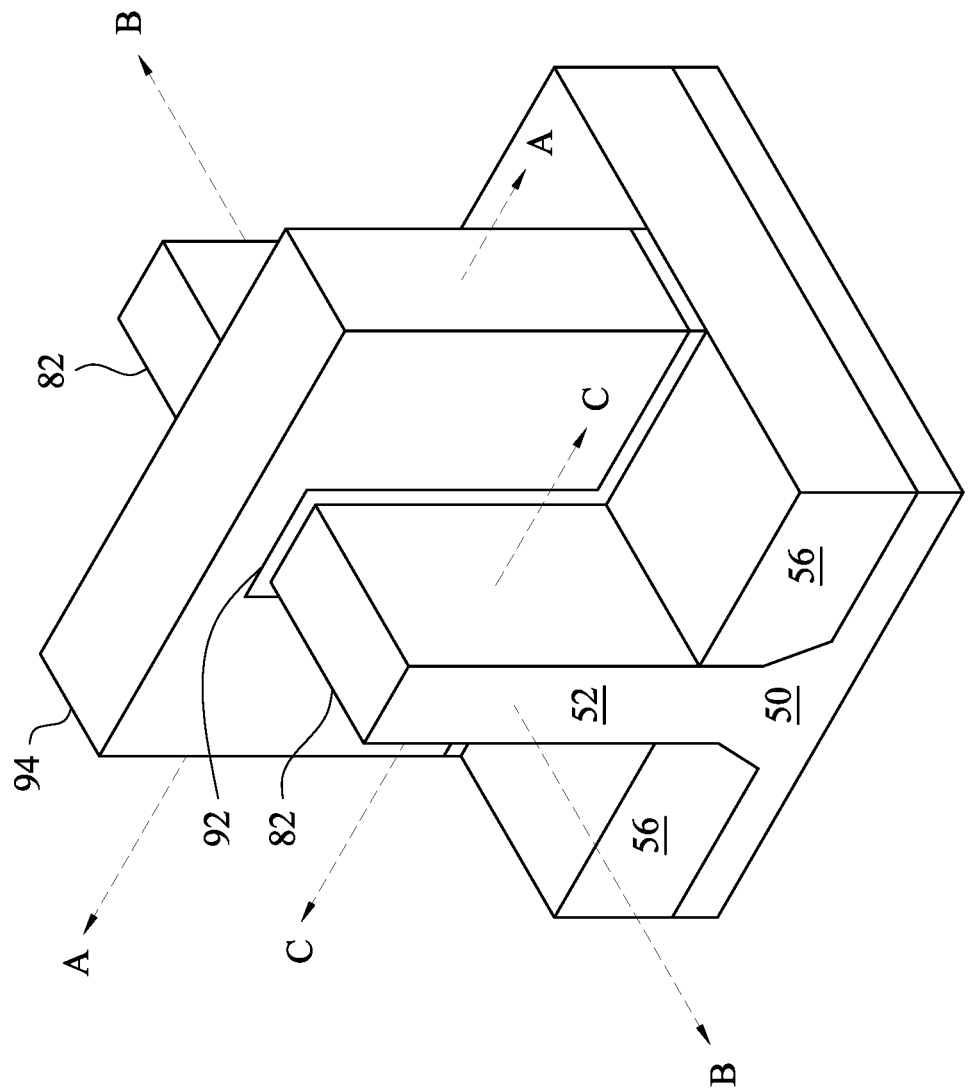
FIG. 1 illustrates an example of a fin field-effect transistor (FinFET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods for forming a die comprising fin field-effect transistors (FinFETs). The methods include forming an insulation material over a semiconductor substrate and etching the insulation material to form semiconductor fins and dielectric fins within the insulation material. The insulation material may then be etched to form isolation regions between the semiconductor fins and the dielectric fins. To improve control over the critical dimensions, shapes, and sizes of the semiconductor fins and to prevent or reduce out-diffusion of materials of the semiconductor fins during subsequent processing steps, a protective semiconductor layer may be formed over the semiconductor fins. For example, certain etches mentioned above and described in detail below may cause first semiconductor fins of one material to have a different size than second semiconductor fins of a different material. The protective semiconductor layer may be selected and formed at varying thicknesses over the first and second semiconductor fins in order to achieve the desired respective critical dimensions. Gate structures may be formed over the first and second semiconductor fins to form transistor structures. Various embodiments may be applied, however, to dies comprising other types of transistors (e.g., nano-structure field-effect transistors (nanoFETs), planar transistors, or the like) in lieu of or in combination with the FinFETs.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 25C are cross-sectional views of intermediate stages in the manufacturing of FinFETs, in accordance with some embodiments. FIGS. 2 through 11A and 12 through 13 illustrate reference cross-section A-A illustrated in FIG. 1, except for multiple fins/FinFETs. FIGS. 14A, 15A, 16A, 17A, 18A, 19A, 20A, 21A, 22A, 23A, 23B, 23C, 24A, 24B, 24C, 25A, 25B, and 25C are illustrated along reference cross-section A-A illustrated in FIG. 1, and FIGS. 14B, 15B, 16B, 17B, 18B, 19B, 20B, 20C, 21B, and 22B are illustrated along a similar cross-section B-B illustrated in FIG. 1, except for multiple fins/FinFETs. FIGS. 16C and 16D are illustrated along reference cross-section C-C illustrated in FIG. 1, except for multiple fins/FinFETs.

Figure 2:
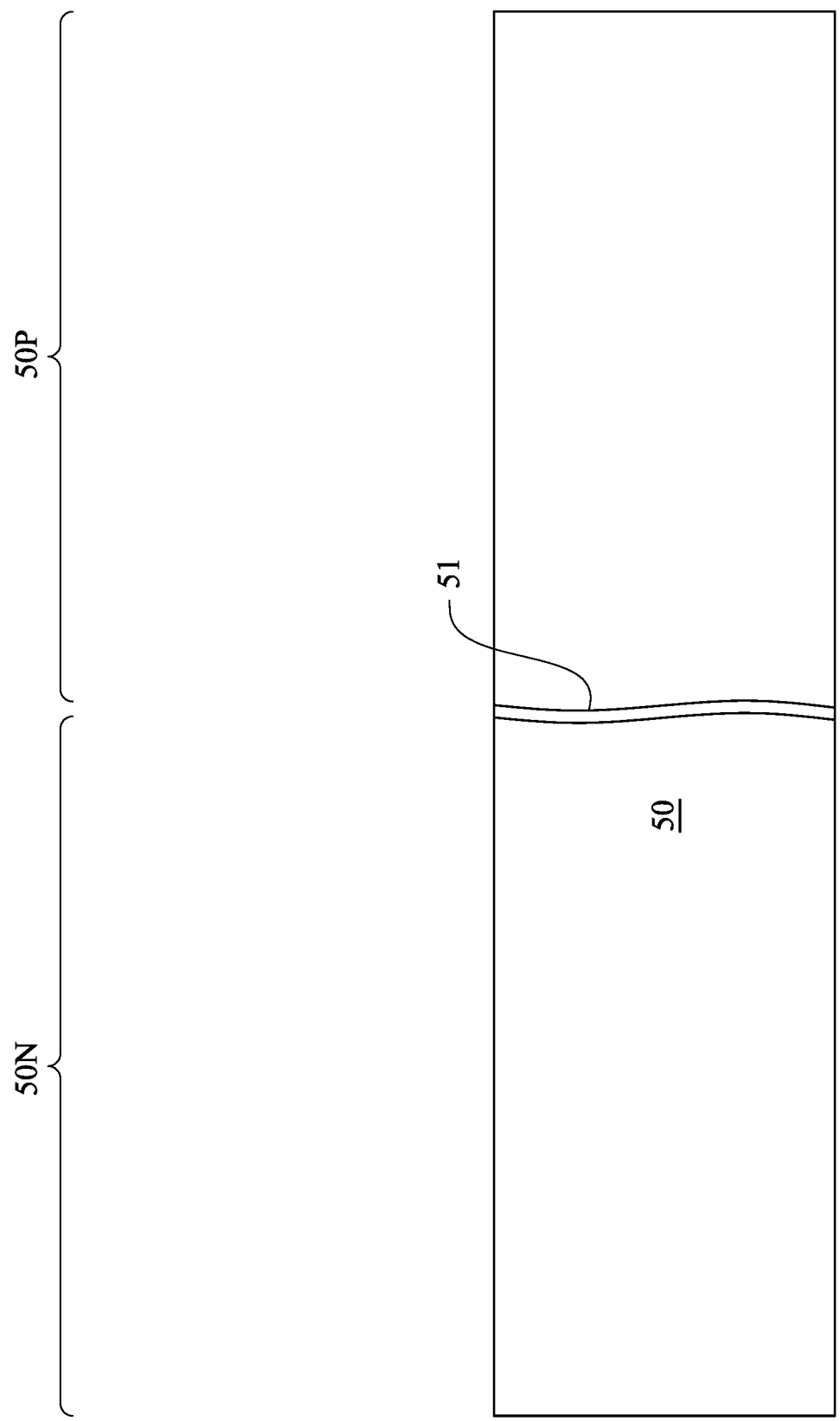
FIGS. 2, 3, 4, 5, 6, 7, 8, 9, 10, 11A, 12, 13, 14A, 14B, 15A, 15B, 16A, 16B, 16C, 16D, 17A, 17B, 18A, 18B, 19A, 19B, 20A, 20B, 20C, 21A, 21B, 22A, 22B, 23A, 23B, 23C, 24A, 24B, 24C, 25A, 25B, and 25C are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N may be for forming n-type devices, such as NMOS transistors, for example, n-type FinFETs. The p-type region 50P can be for forming p-type devices, such as PMOS transistors, for example, p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
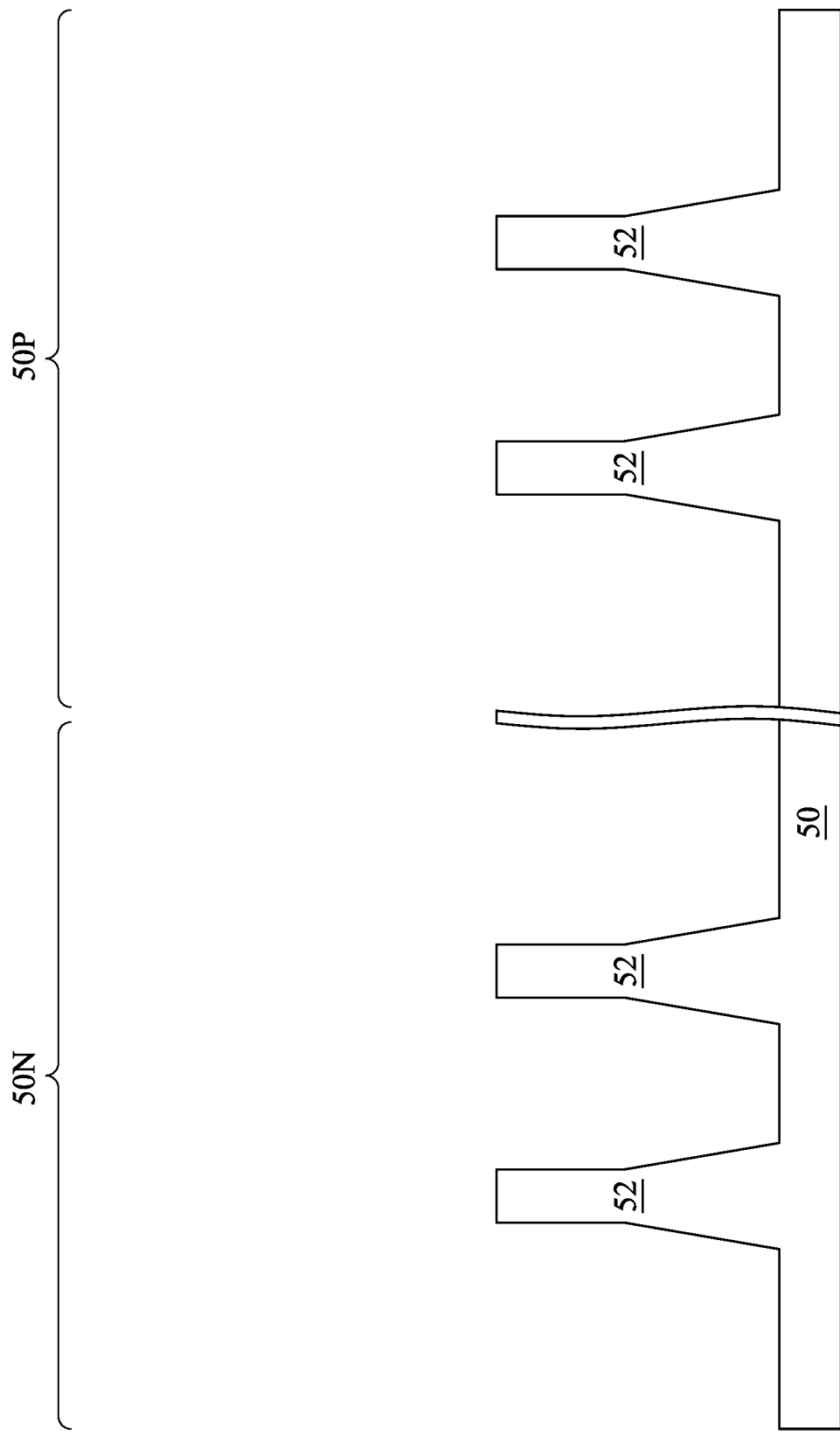

In FIG. 3, fins 52 are formed in the substrate 50. The fins 52 are semiconductor strips. In some embodiments, the fins 52 may be formed in the substrate 50 by etching trenches in the substrate 50. For example, the fins 52 may be silicon fins 52. The etching may be any acceptable etch process, such as a reactive ion etch (RIE), neutral beam etch (NBE), the like, or a combination thereof. The etch may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
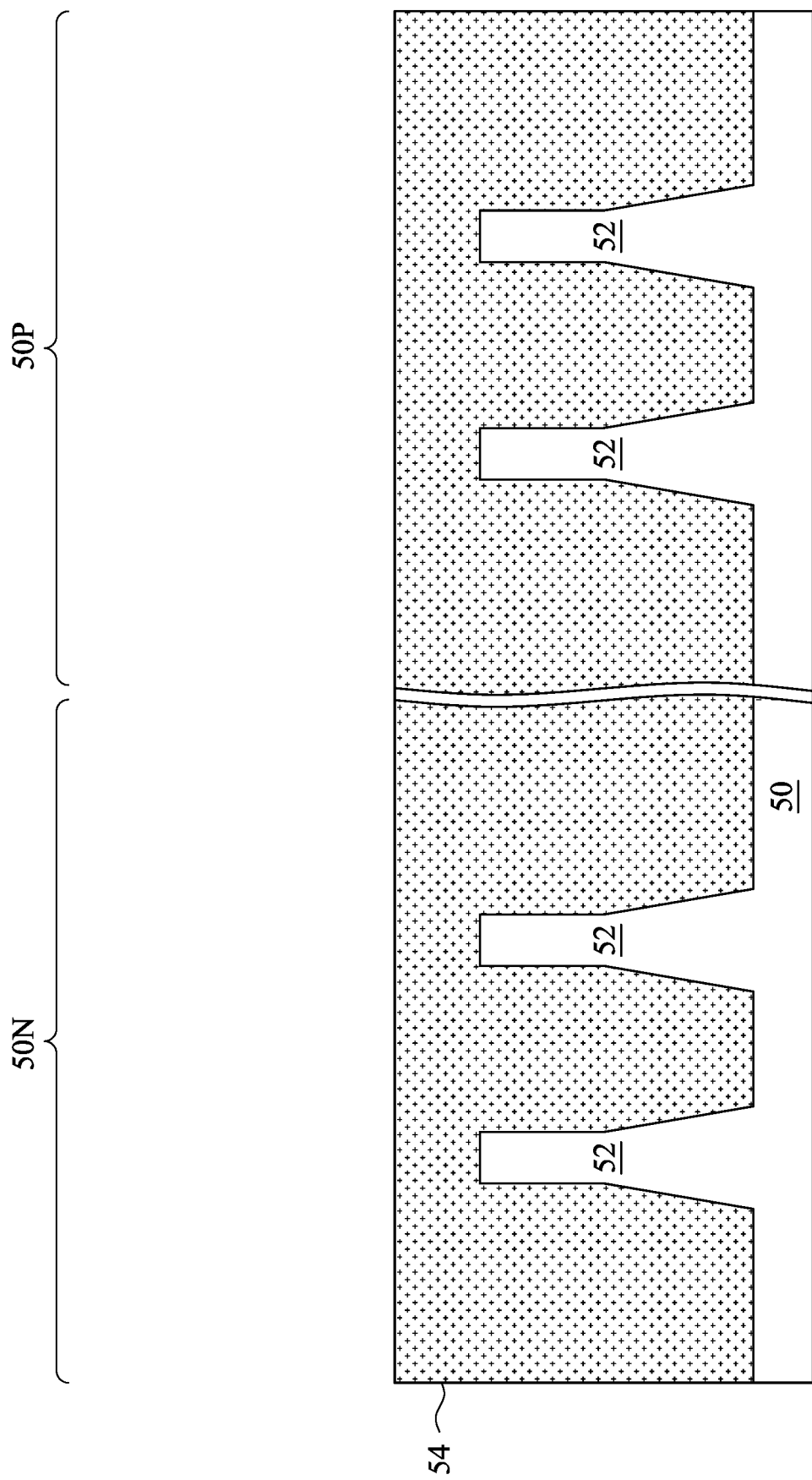

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
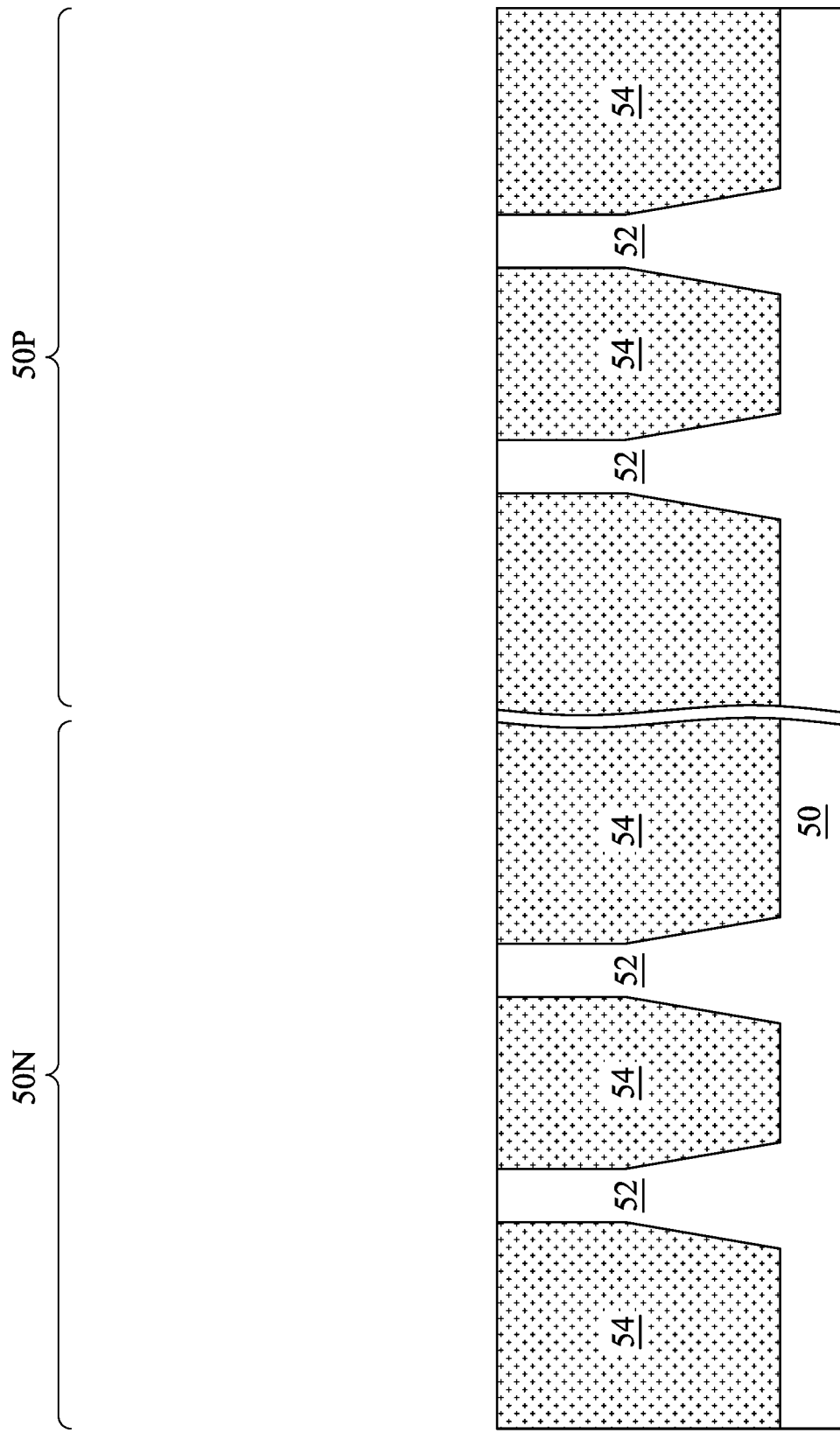

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
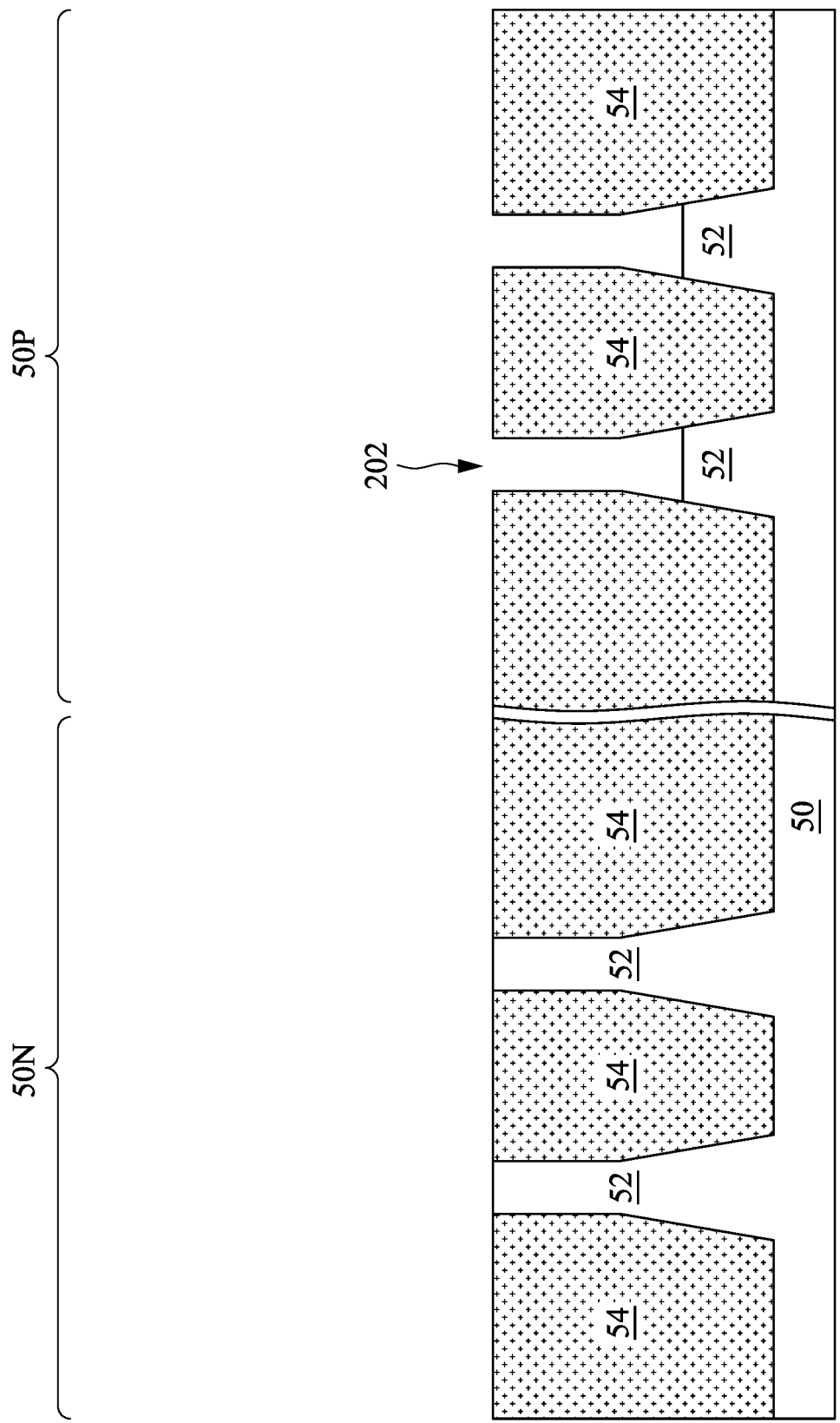

In FIG. 6, a removal process is performed to form openings 202 by removing portions of some of the fins 52 to begin a process for forming fins 204 (illustrated in later figures and further described below) over remaining portions of the partially removed fins 52. In accordance with some embodiments, the openings 202 may be formed in the p-type region 50P using one or more suitable photolithographic masking (not specifically illustrated) and etching processes.

Figure 7:
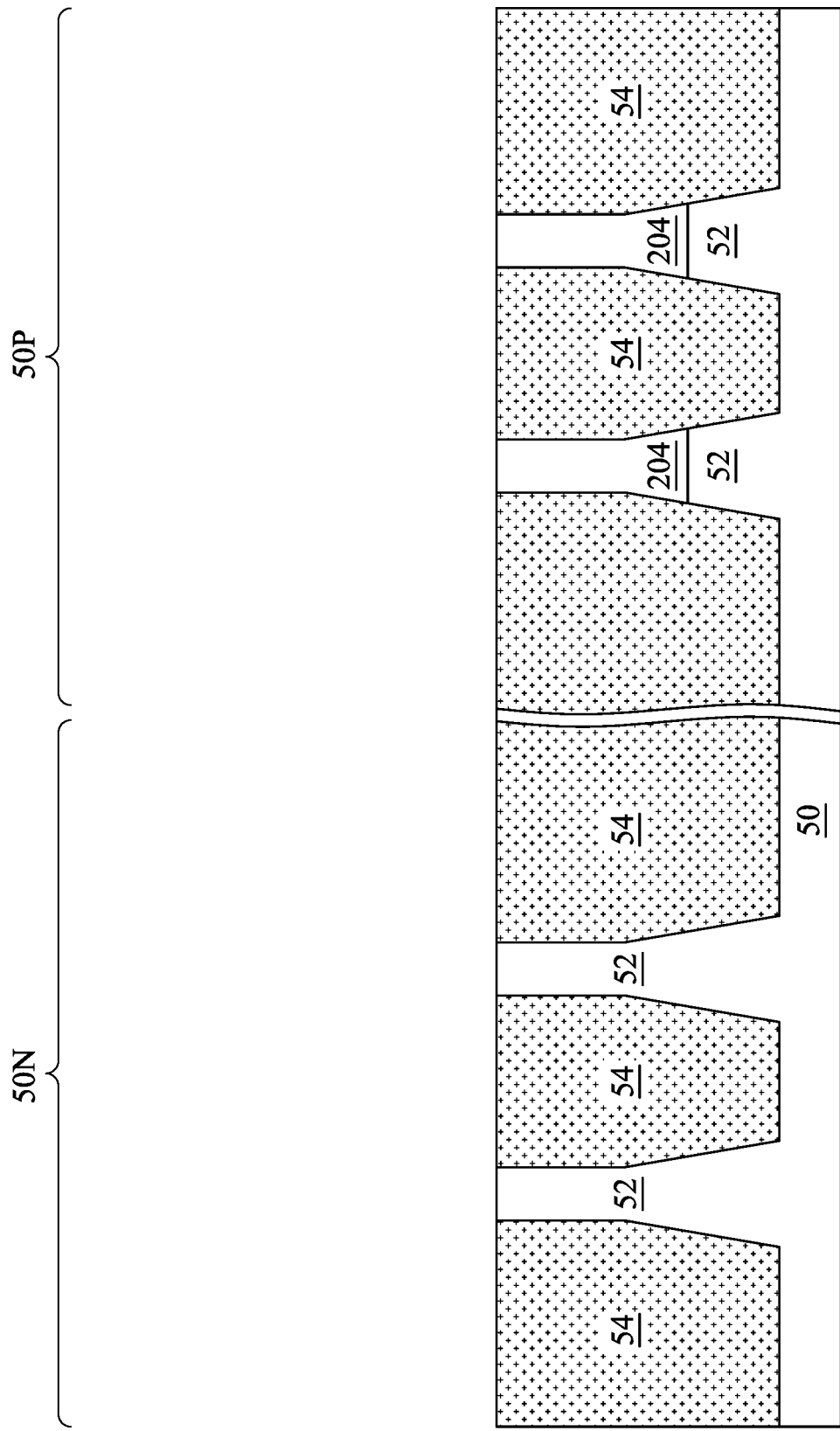

In FIG. 7, the fins 204 are formed by forming a semiconductor material in the openings 202. For example, while the n-type region 50N may be masked (not specifically illustrated), the semiconductor material may be formed by epitaxially (e.g., heteroepitaxially) growing the semiconductor material in the openings 202 over the partially removed fins 52. Following growth of the fins 204, a planarization process (e.g., CMP) may be performed to level the fins 204 with the insulation material 54 and also remove any semiconductor material that may have formed over the insulation material 54. The fins 204 may be formed from a material different than the fins 52, such as silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Figure 8:
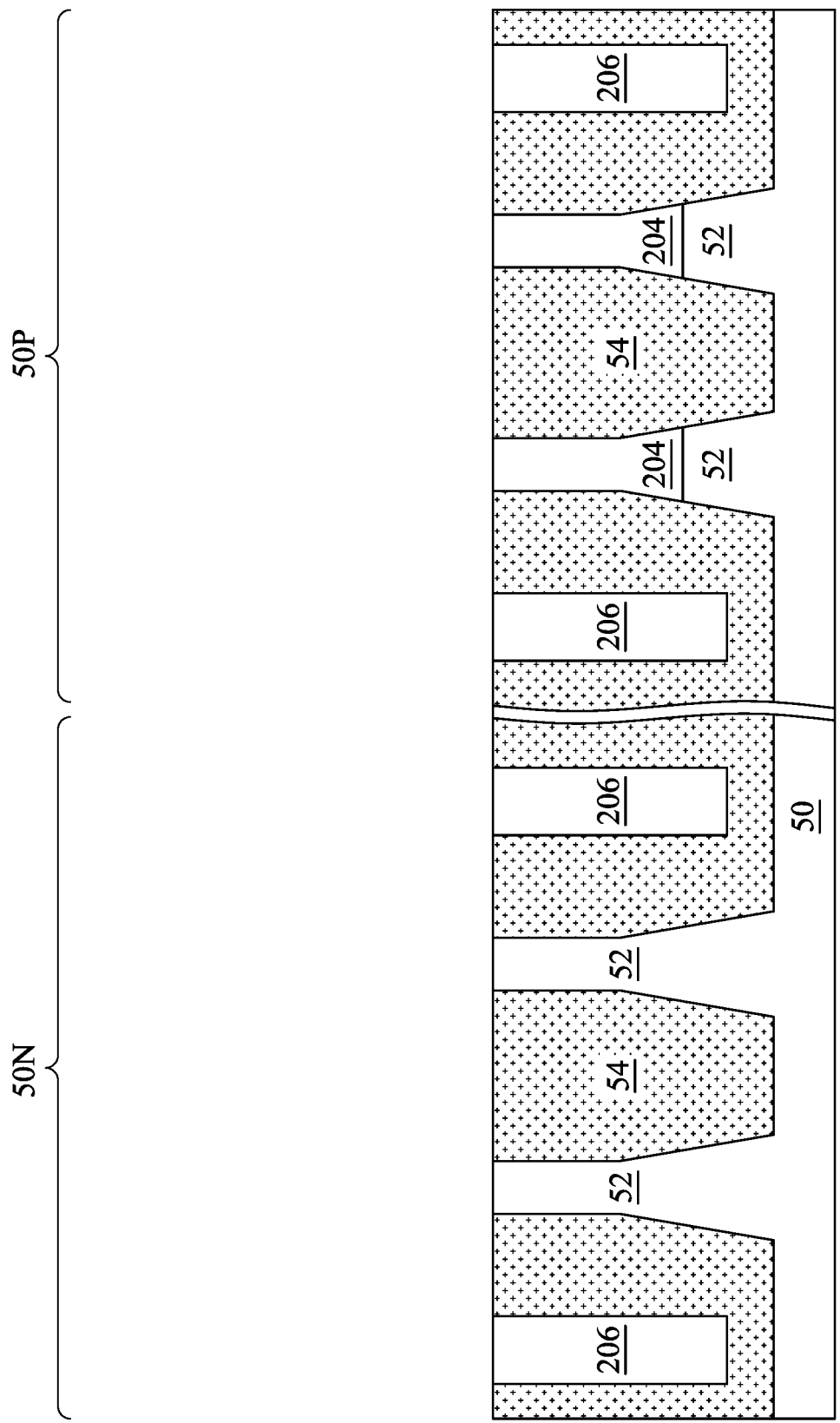

In FIG. 8, dummy fins 206 are formed in the insulation material 54 adjacent to and between the fins 52 and the fins 204. In some embodiments, the dummy fins 206 are dielectric fins, such as hybrid fins, that may comprise dielectric materials that provide insulation between subsequently formed source/drain regions (see below). The dummy fins 206 may be formed by forming openings in the insulation material, for example, by masking and patterning the insulation material 54. One or more materials, such as silicon nitride, silicon oxide, silicon carbonitride, silicon oxycarbonitride, combinations of these, or the like, may then be formed in the openings. The structure may then be planarized (e.g., CMP) to level the dummy fins 206 with the insulation material 54.

Figure 9:
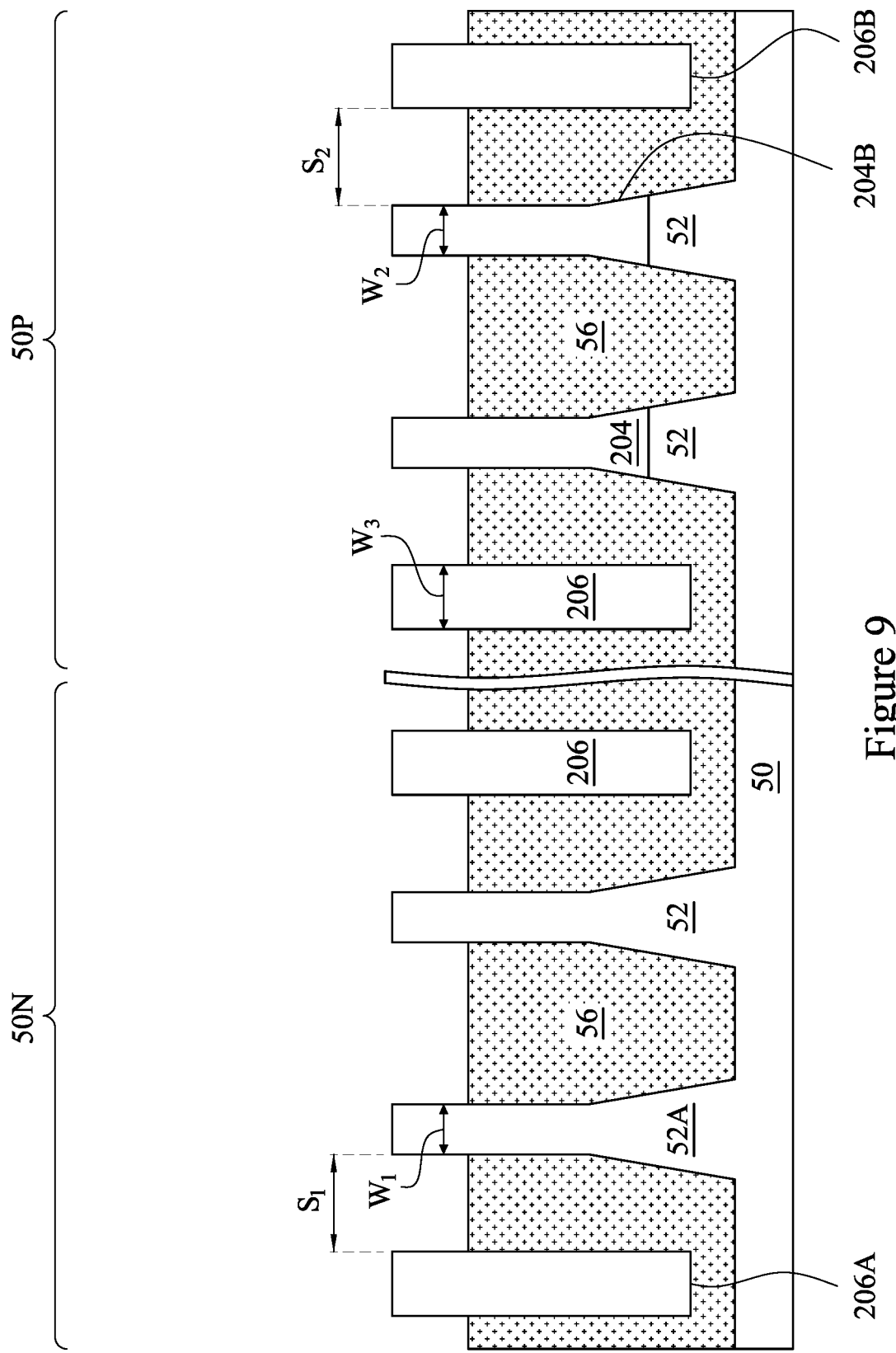

In FIG. 9, the insulation material 54 is recessed to form Shallow Trench Isolation (STI) regions 56. The insulation material 54 is recessed such that upper portions of the fins 52, the fins 204, and the dummy fins 206 in the n-type region 50N and in the p-type region 50P protrude from between neighboring STI regions 56. Further, top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52, the fins 204, and the dummy fins 206). For example, an oxide removal using, for example, dilute hydrofluoric (dHF) acid may be used.

After forming the STI regions 56, for example, a fin 52A may have a width $W_1$ of between about 5 nm and about 30 nm, and a fin 204B may have a width $W_2$ of between about 5 nm and about 30 nm. Each of the dummy fins 206 may have a width $W_3$ of between about 5 nm and about 500 nm. In addition, a sidewall of a first dummy fin 206A and a sidewall of the fin 52A may have a spatial displacement $S_1$ (e.g., a lateral distance of an opening between the first dummy fin 206A and the fin 52A) of between about 5 nm and about 50 nm, and a sidewall of a second dummy fin 206B and a sidewall of the fin 204B may have a spatial displacement $S_2$ of between about 5 nm and about 50 nm. However, any suitable dimensions may be utilized.

Figure 10:
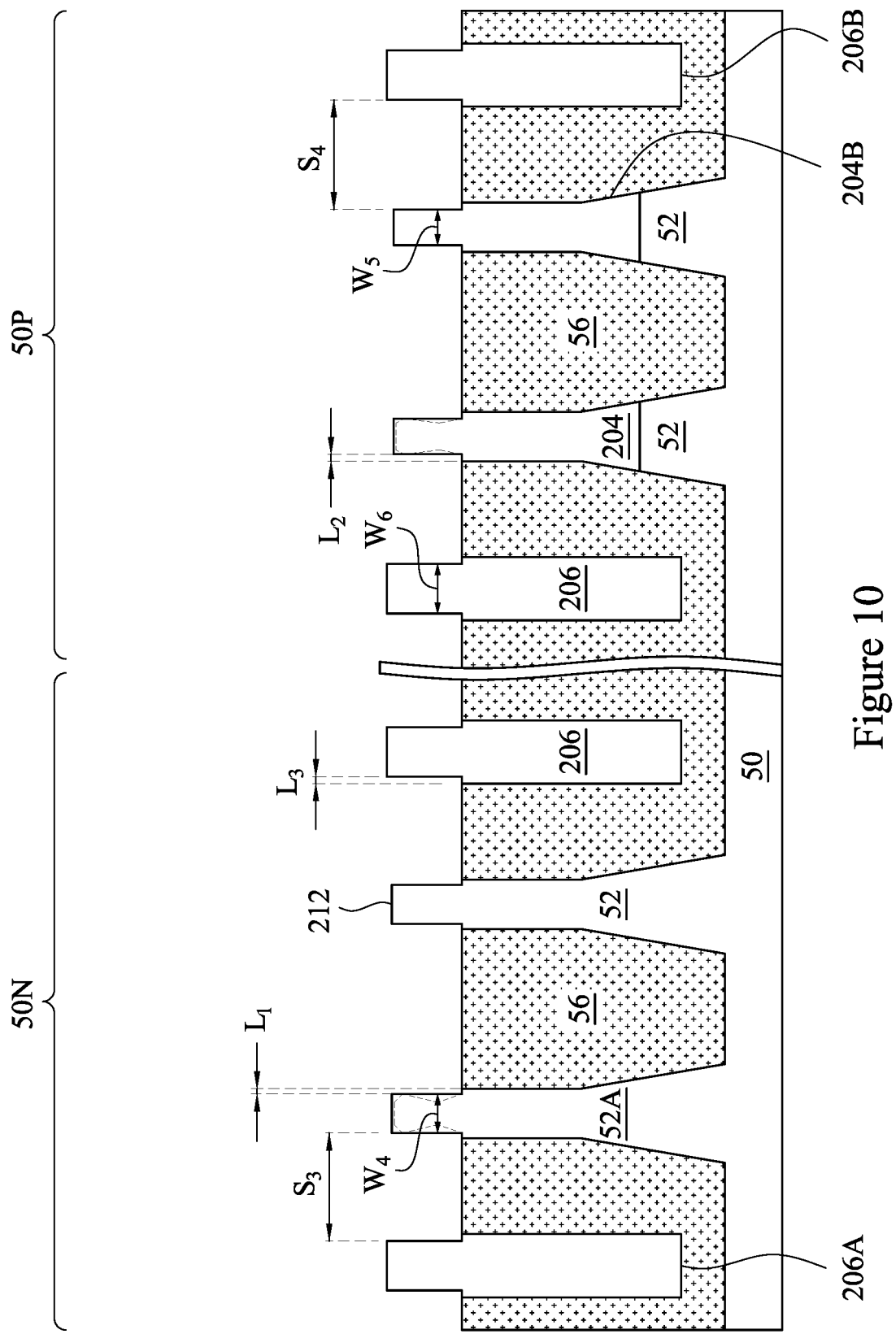

In FIG. 10, the fins 52 and the fins 204 may be trimmed to desired shapes and dimensions. The dummy fins 206 may undergo a trimming as well. Following the trimming, the fins 52 and/or the fins 204 may maintain a substantially squared shape as illustrated. In accordance with other embodiments, the fins 52 and/or the fins 204 may have contours similar to those illustrated with dotted lines such that sidewalls are concave and top surfaces are convex. The trimming may be performed using any suitable wet or dry etch, which may be performed isotropically or anisotropically using, for example, etchants such as buffered hydrogen fluoride (HF), ammonium fluoride ($NH_4F$), dilute HF, ammonium hydroxide ($NH_4OH$), hydrogen peroxide ($H_2O_2$), ozone-deionized water ($O_3$-DI), acetic acid ($CH_3COOH$) any combination thereof, or the like.

The fins 52 may be trimmed such that the sidewalls and top surfaces have a thickness loss $L_1$ of less than about 0.2 nm or between about 0.2 nm and about 5 nm. Similarly, the fins 204 may be trimmed such that the sidewalls and top surfaces have a thickness loss $L_2$ of less than about 0.2 nm or between about 0.2 nm and about 5 nm. In addition, the dummy fins 206 may be trimmed such that the sidewalls and top surfaces have a thickness loss $L_3$ of less than about 0.2 nm or between about 0.2 nm and about 10 nm. As a result, the fin 52A may have a width $W_4$ of between about 5 nm and about 25 nm, the fin 204B may have a width $W_5$ of between about 5 nm and about 25 nm, and each of the dummy fins 206 may have a width $W_6$ of between about 5 nm and about 490 nm. In accordance with some embodiments, the thickness loss $L_3$ may be greater than the thickness loss $L_1$, and the thickness loss $L_2$ may be greater than each of the thickness losses $L_1$ and $L_3$.

In embodiments in which the sidewalls and top surfaces of the fins 52 and the fins 204 comprise concave and convex shapes, respectively, the thickness loss $L_1$ and the thickness loss $L_2$ may reflect the amount of removal at or around middle regions of the sidewalls and middle regions of the top surfaces. In accordance with some embodiments, the thickness loss $L_2$ from the fin 204B may be greater than the thickness loss $L_1$ from the fin 52A.

Due to the thickness loss $L_1$, the width $W_4$ of the fin 52A after the trimming may be between about 85% and about 99% of the width $W_1$ of the fin 52A before the trimming. Due to the thickness loss $L_2$, the width $W_5$ of the fin 204B after the trimming may be between about 85% and about 99% of the width $W_2$ of the fin 204B before the trimming. Due to the thickness loss $L_3$, the width $W_6$ of each of the dummy fins 206 after the trimming may be between about 85% and about 99% of the width $W_3$ of the fin 204B before the trimming. In accordance some embodiments, the width $W_5$ of the fin 204B may have reduced from the width $W_2$ by a greater amount than the width $W_4$ of the fin 52A reduced from the width $W_1$ and also by a greater amount than the width $W_6$ of each of the dummy fins 206 reduced from the width $W_3$.

After the trimming, the sidewall of the first dummy fin 206A and the sidewall of the fin 52A may have an increased spatial displacement $S_3$ of between about 0.2 nm and about 7.5 nm, and the sidewall of the second dummy fin 206B and the sidewall of the fin 204B may have an increased spatial displacement $S_4$ of between about 0.2 nm and about 7.5 nm. As a result, the spatial displacement $S_3$ may be between about 1% and about 10% greater than the spatial displacement $S_1$, and the spatial displacement $S_4$ may be between about 1% and about 10% greater than the spatial displacement $S_2$. In accordance with some embodiments and due to a greater thickness loss $L_2$ of the fins 204, the spatial displacement $S_4$ may have increased from the spatial displacement $S_2$ by a greater amount than the spatial displacement $S_3$ increased from the spatial displacement $S_1$.

Figure 11A:
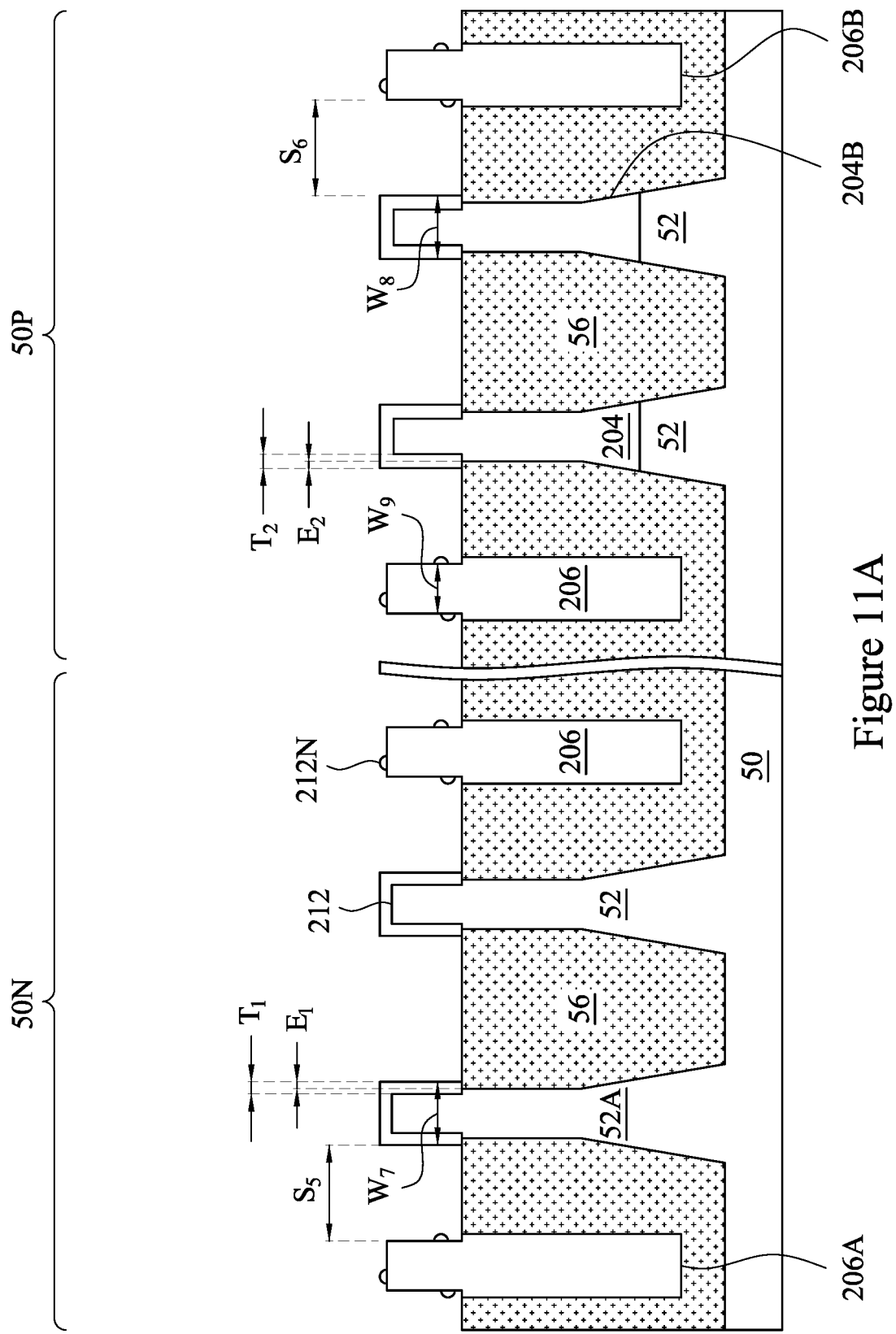

In FIG. 11A, a capping layer 212 may be formed, such as epitaxially grown, over the fins 52 and the fins 204. For example, the capping layer 212 may be formed by growing a silicon material that follows crystalline structures of the underlying fins 52 and/or the fins 204. The capping layer 212 may be formed using a deposition process such as CVD, ALD, epitaxial growth, molecular beam epitaxy (MBE), or any suitable process. For example, the CVD process may be performed using precursors comprising monosilane ($SiH_4$), disilane ($Si_2H_6$), dichlorosilane ($H_2SiCl_2$), or $Si_xH_{2x+2}$ wherein x is between about 1 and about 4.

In some embodiments, the capping layer 212 is formed using one of the above precursors. For example, a precursor comprising monosilane may be flowed by itself at a rate of between about 200 standard cubic centimeters (sccm) and about 6000 sccm. Alternatively, a precursor comprising disilane may be flowed by itself at a rate of between about 200 sccm and about 6000 sccm. The precursor may be accompanied by a carrier gas such as $H_2$ or $N_2$, which may be flowed at a rate of between about 500 sccm and about 10000 sccm and the deposition may be performed at a pressure of between about 0.1 Torr and about 5.0 Torr.

The capping layer 212 may be deposited at a temperature of about or greater than 350° C., such as between about 350° C. and about 750° C. For example, a temperature of near or greater than 380° C. may form the capping layer 212 to a greater thickness over the fins 204 (e.g., comprising silicon-germanium) than over the fins 52 (e.g., comprising silicon) using monosilane or disilane as the precursor. In addition, such a phenomenon may occur to a greater degree for increasingly greater temperatures than 350° C., such as a temperature of near or greater than 500° C., using disilane as the precursor.

In other deposition embodiments, the capping layer 212 may also be formed using two or more precursors flowed simultaneously rather than using just one precursor. For example, the first precursor (e.g., monosilane) may be flowed at a rate of between about 200 sccm and about 6000 sccm, and the second precursor (e.g., disilane) may be flowed at a rate of between about 200 sccm and about 6000 sccm. Similarly as discussed above, the precursors may be accompanied by a carrier gas such as $H_2$ or $N_2$, which may be flowed at a rate of between about 500 sccm and about 10000 sccm. In the case of using monosilane and disilane as precursors, the capping layer 212 may be deposited at a temperature of between about 350° C. and about 500° C., and at a pressure of between about 0.1 Torr and about 5.0 Torr.

Figure 11B:
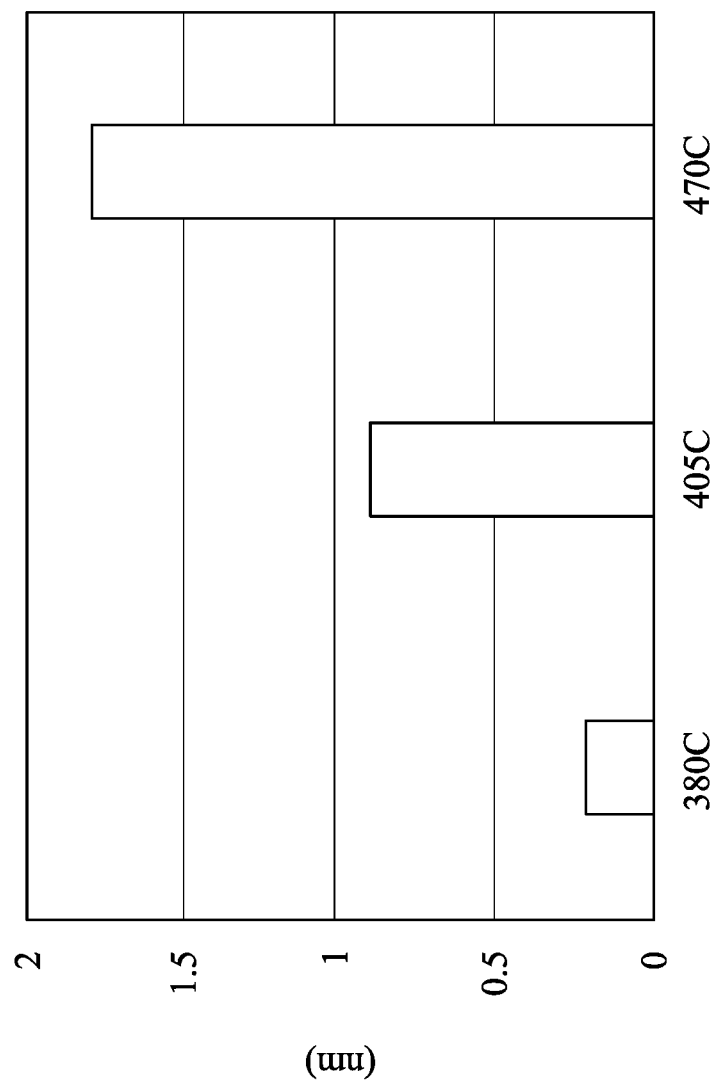
FIG. 11B is a graph illustrating phenomenon related to intermediate stages in the manufacturing of FinFETs, in accordance with some embodiments.

Referring briefly to FIG. 11B, the graph illustrates the relative differences between how a silicon material (e.g., the capping layer 212) with a dummy dielectric layer 60 (see FIG. 12) may form on silicon material (e.g., the fins 52) and on silicon-germanium material (e.g., the fins 204). FIG. 11B illustrates that after a specified time at a temperature of about 380° C. using a precursor comprising disilane, the capping layer 212 (with dummy dielectric layer 60) directly on the fins 204 may be between about 0.1 nm and about 0.3 nm thicker than the capping layer 212 (with dummy dielectric layer 60) directly on the fins 52. In addition, after a specified time at a temperature of about 405° C. using a precursor comprising disilane, the capping layer 212 (with dummy dielectric layer 60) directly on the fins 204 may be between about 0.6 nm and about 1.2 nm thicker than the capping layer 212 (with dummy dielectric layer 60) directly on the fins 52. Further, after a specified time at a temperature of about 470° C. using a precursor comprising monosilane, the capping layer 212 directly on the fins 204 (with dummy dielectric layer 60) may be between about 1.5 and about 2.1 nm thicker than the capping layer 212 (with dummy dielectric layer 60) directly on the fins 52.

Referring again to FIG. 11A, the capping layer 212 may be formed over sidewalls and top surfaces of the fins 52 with a thickness $T_1$ of between about 0.5 nm and about 1.5 nm. Similarly, the capping layer 212 may be formed over sidewalls and top surfaces of the fins 204 with a thickness $T_2$ of between about 0.5 nm and about 3 nm. As a result, the fin 52A and the capping layer 212 on its corresponding sidewalls may have a width $W_7$ of between about 6 nm and about 28 nm, the fin 204B and the capping layer 212 on its corresponding sidewalls may have a width $W_8$ of between about 6 nm and about 31 nm, and each of the dummy fins 206 may have a width $W_9$ that is substantially the same as the width $W_6$ as the nodules 212N form over the dummy fins 206 rather than the capping layer 212 as a continuous layer. In accordance with some embodiments in which the capping layer 212 grows faster and thicker over the fins 204 than over the fins 52, the thickness $T_2$ of the capping layer 212 over the fin 204B may be greater than the thickness $T_1$ of the capping layer 212 over the fin 52A.

In embodiments in which the fins 204 comprise germanium (e.g., silicon-germanium), during formation of the capping layer 212, some of the germanium may out-diffuse from the fins 204 and into the capping layer 212. As such, portions of the capping layer 212 adjacent to the fins 204 may comprise a concentration gradient of germanium beginning from a location at or proximal to the fins 204 and extending through a portion of, a bulk of or an entirety of the capping layer 212. The processing temperature affects the extent of the out-diffusion, such that there may be greater out-diffusion with greater processing temperatures. In some embodiments, after using processing temperatures of between about 350° C. and about 500° C., the germanium concentration near the fins 204 may be between about 5 at. % and about 75 at. %, and the germanium concentration at a midpoint (e.g., about 1 nm from the corresponding fin 204) of the thickness of the capping layer 212 may be between about 2 at. % and about 10 at. %. In other embodiments, after using processing temperatures of between about 500° C. and about 750° C., the germanium concentration near the fins 204 may be between about 5 at. % and about 75 at. %, and the germanium concentration at a midpoint (e.g., about 1 nm from the corresponding fin 204) of the thickness of the capping layer 212 may be between about 2 at. % and about 10 at. %.

As further illustrated in FIG. 11A, the material, such as silicon, of the capping layer 212 may also form clusters or nodules 212N (e.g., nonepitaxial nodules) over the dummy fins 206. For example, in addition to using the particular above-described processing conditions, the dummy fins 206 may comprise a material on which the silicon material of the capping layer 212 grows more slowly if at all. In addition, the dummy fins 206 may comprise an amorphous material (e.g., without a crystalline pattern for the material of the capping layer 212 to follow). As such, to the extent the silicon material deposits over the dummy fins 206 during formation of the capping layer 212, such deposited material may take the form of discontinuous nodules 212N leaving a majority of exposed surfaces of the dummy fins 206 as remaining exposed.

Due to the thicknesses $T_1$ and $T_2$ of the capping layer 212, the width $W_7$ of the fin 52A and corresponding portion of the capping layer 212 may be between about 2% and about 15% greater than the width $W_4$ of the trimmed fin 52A, and the width $W_8$ of the fin 204B and corresponding portion of the capping layer 212 may be between about 2% and about 20% greater than the width $W_5$ of the trimmed fin 204B. In accordance with some embodiments, the width $W_8$ may have increased from the width $W_5$ of the fin 204B by a greater amount than the width $W_7$ increased from the width $W_4$ of the fin 52A.

After formation of the capping layer 212, the sidewall of the first dummy fin 206A and the sidewall of the fin 52A (and its corresponding portion of the capping layer 212) may have a spatial displacement $S_5$ of between about 5 nm and about 30 nm, and the sidewall of the second dummy fin 206B and the sidewall of the fin 204B (and its corresponding portion of the capping layer 212) may have a spatial displacement $S_6$ of between about 5 nm and about 30 nm. As a result, the spatial displacement $S_5$ may be between about 85% and about 98% of the spatial displacement $S_3$ before formation of the capping layer 212, and the spatial displacement $S_6$ may be between about 80% and about 98% of the spatial displacement $S_4$ before formation of the capping layer 212. In accordance with some embodiments, the spatial displacement $S_6$ may have decreased from the spatial displacement $S_4$ by a greater amount than the spatial displacement $S_5$ increased from the spatial displacement $S_3$.

In some embodiments, a portion of the capping layer 212 over the fins 52 and proximal to the STI region 56 may extend directly over the STI region 56 by an extension $E_1$ of between about 0.2 nm and about 1 nm. In addition, a portion of the capping layer 212 over the fins 204 and proximal to the STI region 56 may extend directly over the STI region 56 by an extension $E_2$ of between about 0.2 nm and about 1 nm. Alternatively, the capping layer 212 over some or all of the fins 52 and proximal to the STI region 56 may extend directly over the STI region 56, while the capping layer 212 over the fins 204 and proximal to the STI region 56 may not extend directly over the STI region 56. Vice versa, the opposite may be the case with respect to the capping layer 212 over the fins 52 and the fins 204.

It should be appreciated how the shapes and dimensions of the fins 52 and the fins 204 (and their corresponding layers) may change throughout the various steps described in connection with FIGS. 9-11B. For example, in accordance with some embodiments, the fins 52 and the fins 204 may be formed in FIG. 9 to be substantially the same size, such that the width $W_1$ and the width $W_2$ are substantially the same. After the trimming process of FIG. 10, the fins 204 may be trimmed to a greater degree than the fins 52, such that the width $W_4$ is greater than the width $W_5$. After forming the capping layer 212 in FIG. 11A to be thicker over the fins 204 than the fins 52, the width $W_7$ and the width $W_8$ may be substantially the same. Alternatively, the capping layer 212 may be formed such that the width corresponding to the fins 52 (e.g., the width $W_7$) remains greater than the width corresponding to the fins 204 (e.g., the width $W_8$), or vice versa in which the width $W_8$ is greater than the width $W_7$.

In accordance with other embodiments, the fins 52 may be formed to be larger than the fins 204 in FIG. 9, such that the width $W_1$ is greater than the width $W_2$. After the trimming process of FIG. 10, the width $W_4$ of the fins 52 may remain greater than the width $W_5$ of the fins 204. However, after forming the capping layer 212 in FIG. 11A, the width $W_7$ of the fins 52 and the width $W_8$ of the fins 204 may be substantially the same. Alternatively, the width $W_7$ may remain greater than (or become lesser than) than the width $W_8$ depending on the selected parameters and process conditions for forming the capping layer 212.

Note that these immediately foregoing examples are intended to provide clarification to some of the advantages and ways to manipulate the relative shapes and dimensions of the fins 52 and the fins 204 and, in no way, are intended to limit the disclosure. Many additional dynamics with respect to the relative shapes and dimensions may be achieved by using the processing conditions and parameters described throughout.

The capping layer 212 provides protection to the fins 52 and the fins 204 from oxidation during subsequent steps. The capping layer 212 further provides a barrier from out-diffusion of materials in the fins 52 and the fins 204, for example, preventing or reducing out-diffusion of germanium in embodiments in which the fins 204 comprise silicon-germanium. Further, as noted above, the degree to which the spatial displacements $S_5$ and $S_6$ reduce in size from the spatial displacements $S_3$ and $S_4$, respectively, is controlled or limited by forming the capping layer 212 over the fins 52 and the fins 204 but not over the dummy fins 206. Maintaining greater spatial displacements improves the effectiveness of subsequently forming other layers over and between the fins (e.g., the fins 52, the fins 204, and the dummy fins 206) without voids, as described in greater detail below.

Further in FIG. 11A, appropriate wells (not shown) may be formed in the fins 52, the fins 204, and/or the substrate 50. In some embodiments, a P well may be formed in the n-type region 50N, and an N well may be formed in the p-type region 50P. In some embodiments, a P well or an N well are formed in both the n-type region 50N and the p-type region 50P. Note that the wells may be formed prior to formation of the capping layer 212, which means the capping layer 212 may not comprise the dopant impurities described below. Alternatively, the wells may be formed after formation of the capping layer 212, which means the capping layer 212 will comprise the dopant impurities described below.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{66}$ cm$^{-3}$ and about $10^{18}$ cm$^{-3}$. After the implant, the photoresist is removed, such as by an acceptable ashing process.

Following the implanting of the p-type region 50P, a photoresist is formed over the fins 204 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 12:
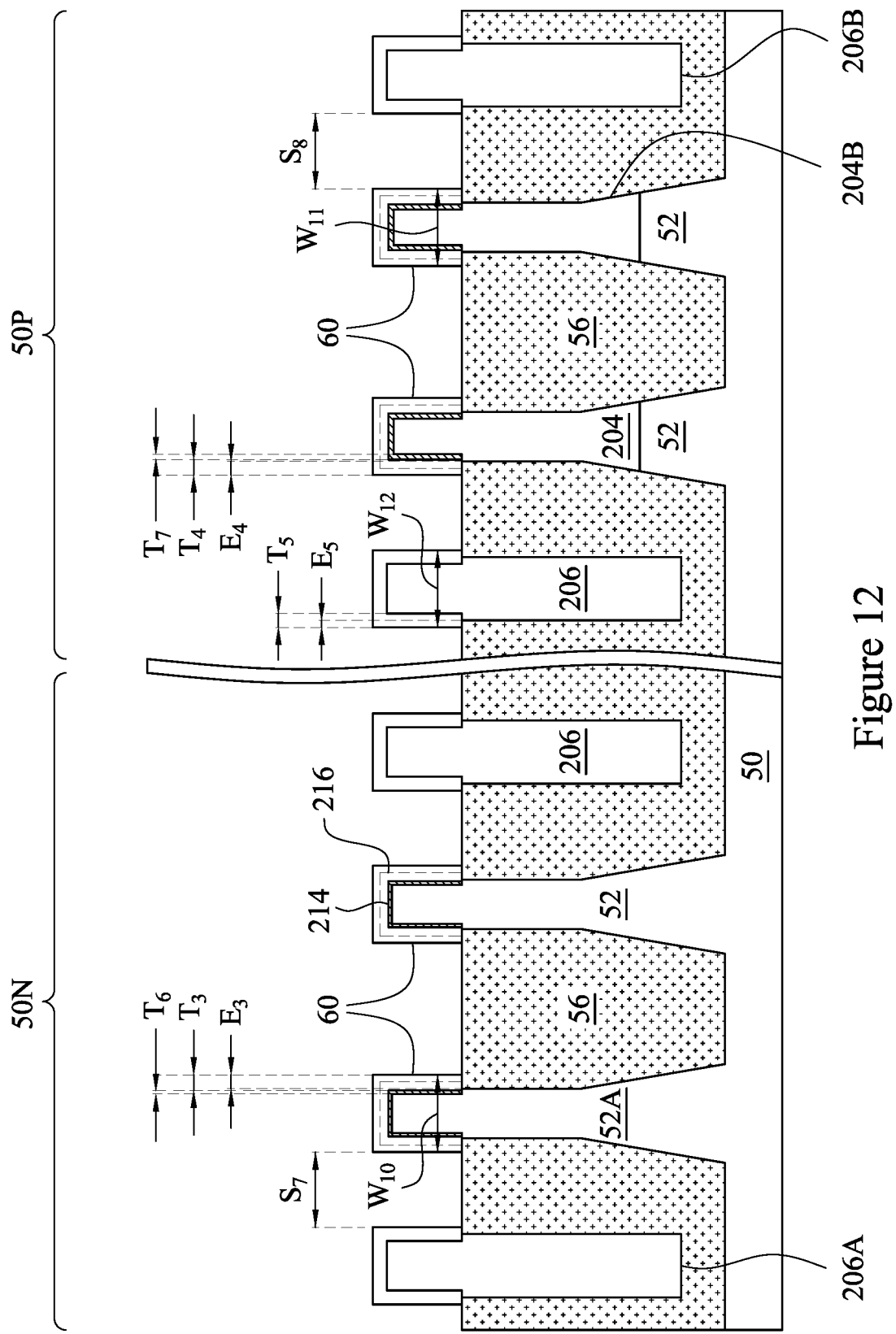

In FIG. 12, a dummy dielectric layer 60 is formed on the fins 52. The dummy dielectric layer 60 may be, for example, silicon oxide (SiO$_x$), silicon nitride (SiN$_x$), hafnium oxide (HfO$_x$), a combination thereof, or the like, and may be deposited or thermally grown according to acceptable techniques. The dummy dielectric layer 60 may be formed over the fins 52 to have a thickness $T_3$ of between about 1 nm and about 5 nm, over the fins 204 to have a thickness $T_4$ of between about 1 nm and about 5 nm, and over the dummy fins 206 to have a thickness $T_5$ of between about 1 nm and about 5 nm. Although not specifically illustrated, the dummy dielectric layer 60 may be formed over an entirety of the STI regions 56.

As illustrated and in accordance with some embodiments, formation of the dummy dielectric layer 60 may also oxidize portions of the capping layer 212 to form an intermediate layer 216 (illustrated with dotted lines) over the fins 52 and the fins 204. Those portions of the capping layer 212—that is, the intermediate layer 216—may be considered as parts of the dummy dielectric layer 60. For example, when the dummy dielectric layer 60 is deposited to have a composition of $SiO_x$ in the outer or newly deposited portion, the intermediate layer 216 may have a composition of $SiO_y$, wherein y is less than x. In some embodiments, the intermediate layer 216 comprises a gradient composition between a location at or proximal to the dotted line and a location at or proximal to the remaining capping layer 212. Note that the intermediate layer 216 is not separately illustrated in subsequent figures.

Additionally, as a result of portions of the capping layer 212 being converted to become parts of the dummy dielectric layer 60, unoxidized portions of the capping layer 214 over the fins 52 may reduce to a thickness $T_6$ of between about 0 nm and about 1 nm, and unoxidized portions of the capping layer 214 over the fins 204 may reduce to a thickness $T_7$ of between about 0 nm and about 2.5 nm. Alternatively, all or substantially all of the capping layer 212/214 may remain unoxidized during formation of the dummy dielectric layer 60. Further and in accordance with other embodiments not specifically illustrated, an entirety of the capping layer 212 may be oxidized during formation of the dummy dielectric layer 60 and, therefore, may convert to become parts of the dummy dielectric layer 60. In some embodiments in which the thickness $T_2$ is greater than the thickness $T_1$, an entirety of the thickness $T_1$ of the capping layer 212 of the fins 52 may be converted while only a portion of the thickness $T_2$ of the capping layer 212 over the fins 204 may be converted. As a result, the remaining capping layer 214 may be interposed between the dummy dielectric layer 60 and the fins 204, while the dummy dielectric layer 60 directly contacts the fins 52.

Although not specifically illustrated due to clarity purposes, it should be noted that the nodules 212N may remain on the dummy fins 206 after formation of the dummy dielectric layer 60. Similarly as discussed with respect to the capping layer 212, these nodules may be converted (e.g., oxidized) to a material composition that is the same or similar to that of the intermediate layer 216. The resulting nodules may have a different composition than the bulk of the dummy dielectric layer 60. The nodules 212N, whether converted in part or completely, may remain within the dummy dielectric layer 60 through subsequent processing.

As a result of forming the dummy dielectric layer 60, the fin 52A and the dummy dielectric layer 60 (and the capping layer 214, if any) on its corresponding sidewalls may have a width $W_{10}$ of between about 6 nm and about 30 nm, the fin 204B and the dummy dielectric layer 60 (and the capping layer 214, if any) on its corresponding sidewalls may have a width $W_{11}$ of between about 6 nm and about 30 nm, and each of the dummy fins 206 and the dummy dielectric layer 60 on its corresponding sidewalls may have a width $W_{12}$ of between about 6 nm and about 500 nm. In accordance with some embodiments, a sum of the thickness $T_4$ of the dummy dielectric layer 60 and the thickness $T_7$ of the capping layer 214 over the fin 204B may be greater than a sum of the thickness $T_3$ of the dummy dielectric layer 60 and the thickness $T_6$ of the capping layer 214 over the fin 52A. In addition, the sum of the thickness $T_3$ and the thickness $T_6$ may be greater than the thickness $T_5$ over the dummy fins 206.

In some embodiments the width $W_{10}$ of the fin 52A and corresponding portions of the dummy dielectric layer 60 and the capping layer 214 may be between about 1% and about 30% greater than the width $W_7$, and the width $W_{11}$ of the fin 204B and corresponding portions of the dummy dielectric layer 60 and the capping layer 214 may be between about 1% and about 30% greater than the width $W_8$. In accordance with some embodiments, the width $W_{11}$ may have increased from the width $W_8$ by a greater amount than the width $W_{10}$ increased from the width $W_5$ of the fin 52A.

After formation of the dummy dielectric layer 60, the sidewall of the first dummy fin 206A (and its corresponding portion of the dummy dielectric layer 60) and the sidewall of the fin 52A (and its corresponding portions of the capping layer 214 and the dummy dielectric layer 60) may have a spatial displacement $S_7$ of between about 5 nm and about 50 nm, and the sidewall of the second dummy fin 206B (and its corresponding portion of the dummy dielectric layer 60) and the sidewall of the fin 204B (and its corresponding portions of the capping layer 214 and the dummy dielectric layer 60) may have a spatial displacement $S_8$ of between about 5 nm and about 50 nm. As a result, the spatial displacement $S_7$ may be between about 60% and about 95% of the spatial displacement $S_5$ before formation of the dummy dielectric layer 60, and the spatial displacement $S_8$ may be between about 60% and about 95% of the spatial displacement $S_6$ before formation of the dummy dielectric layer 60. In accordance with some embodiments, the spatial displacement $S_8$ may have decreased from the spatial displacement $S_6$ by a greater amount than the spatial displacement $S_7$ decreased from the spatial displacement $S_5$.

In some embodiments, a portion of the dummy dielectric layer 60 over the fins 52 and proximal to the STI region 56 may extend directly over the STI region 56 by an extension $E_3$ of between about 1 nm and about 5 nm. In addition, a portion of the dummy dielectric layer 60 over the fins 204 and proximal to the STI region 56 may extend directly over the STI region 56 by an extension $E_4$ of between about 1 nm and about 5 nm. Further, a portion of the dummy dielectric layer 60 over the dummy fins 206 and proximal to the STI region 56 may extend directly over the STI region 56 by an extension $E_5$ of between about 1 nm and about 5 nm. Alternatively, the dummy dielectric layer 60 over some or all of the fins 52 and proximal to the STI region 56 may extend directly over the STI region 56, while the dummy dielectric layer 60 over the fins 204 and proximal to the STI region 56 does not extend directly over the STI region 56. Vice versa, the opposite may be the case with respect to the dummy dielectric layer 60 over the fins 52 and the fins 204.

Figure 13:
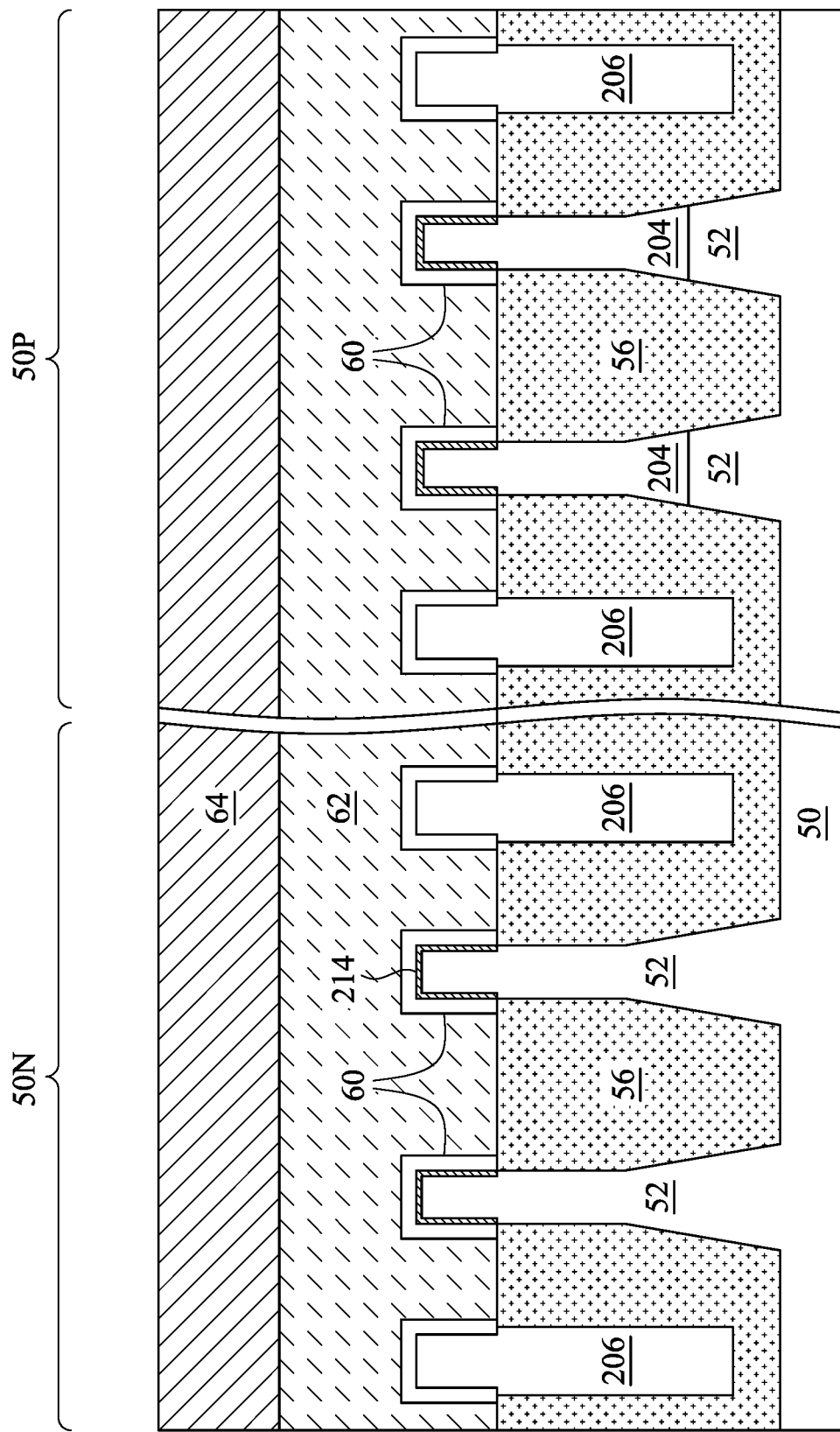

In FIG. 13, a dummy gate layer 62 is formed over the dummy dielectric layer 60, and a mask layer 64 is formed over the dummy gate layer 62. As noted above, due to maintaining greater spatial displacements between adjacent fins (e.g., spatial displacements $S_5$ and $S_6$) during formation of the capping layer 212, the dummy gate layer 62 may be formed with greater efficiency and with fewer or no voids. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (poly-silicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

FIGS. 14A through 22B illustrate various additional steps in the manufacturing of embodiment devices. FIGS. 14A through 22B illustrate features in either of the n-type region 50N and the p-type region 50P. For example, the structures illustrated in FIGS. 14A through 22B may be applicable to both the n-type region 50N (e.g., including the fins 52) and the p-type region 50P (e.g., including the fins 204). Differences (if any) in the structures of the n-type region 50N and the p-type region 50P are described in the text accompanying each figure.

Figure 14B:
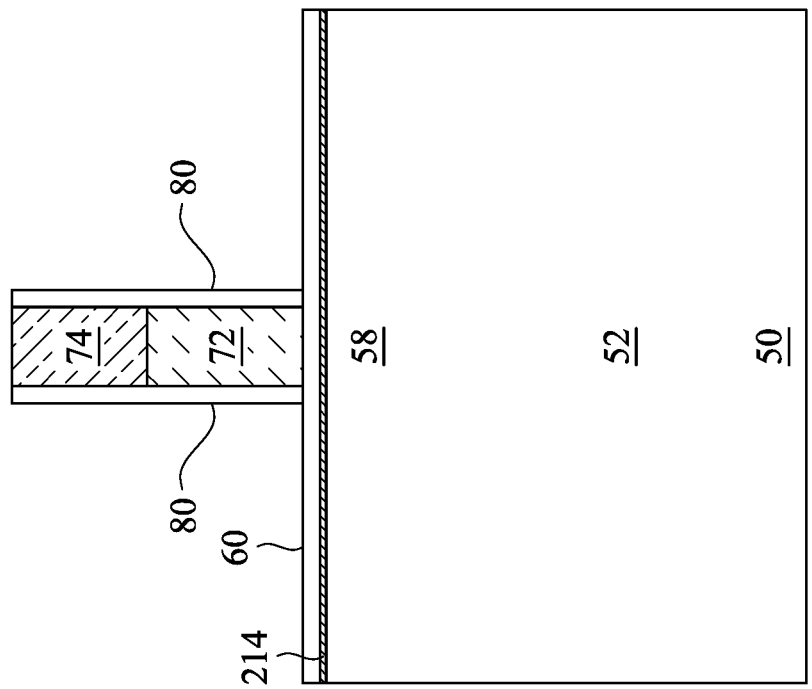
Figure 14A:
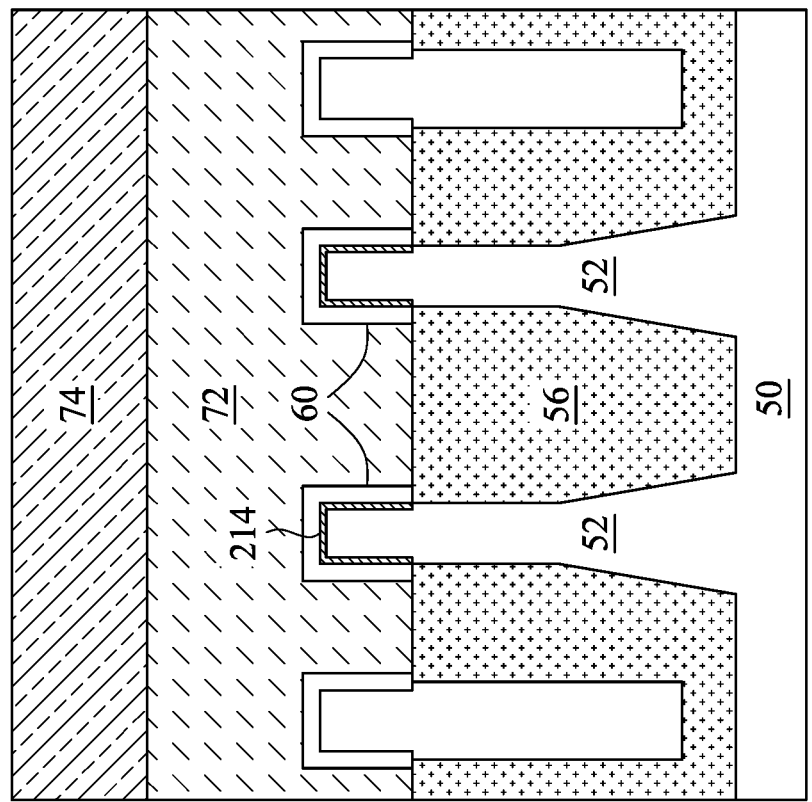

In FIGS. 14A and 14B, the mask layer 64 (see FIG. 13) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 14A and 14B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above, a mask, such as a photoresist, may be formed over the n-type region 50N, while exposing the p-type region 50P, and appropriate type (e.g., p-type) impurities may be implanted into the exposed fins 204 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 15B:
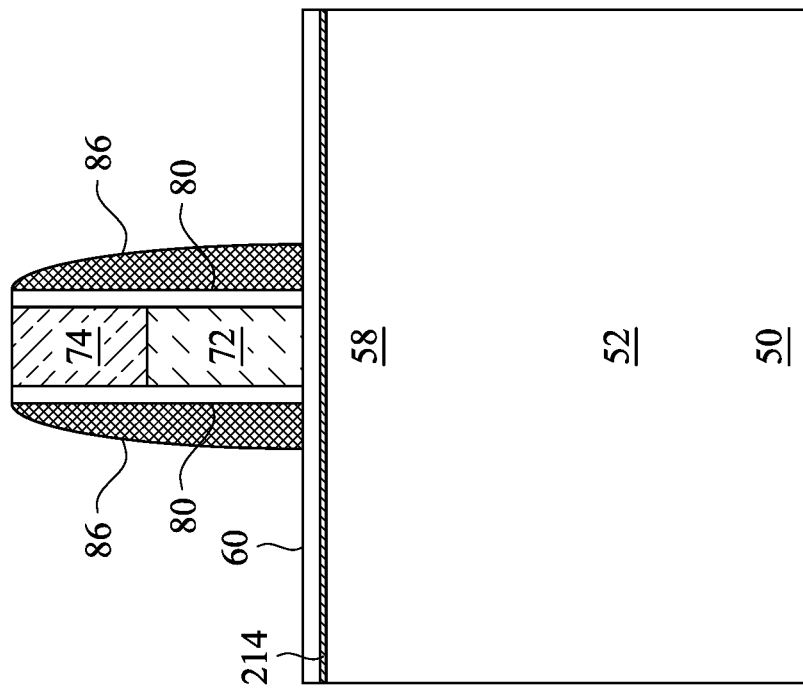
Figure 15A:
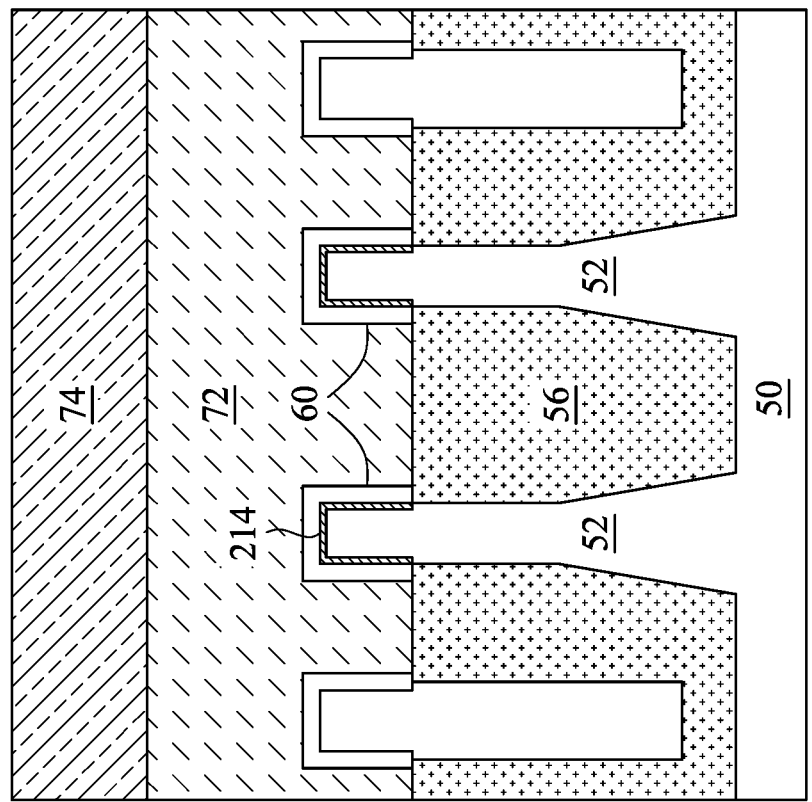

In FIGS. 15A and 15B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 16B:
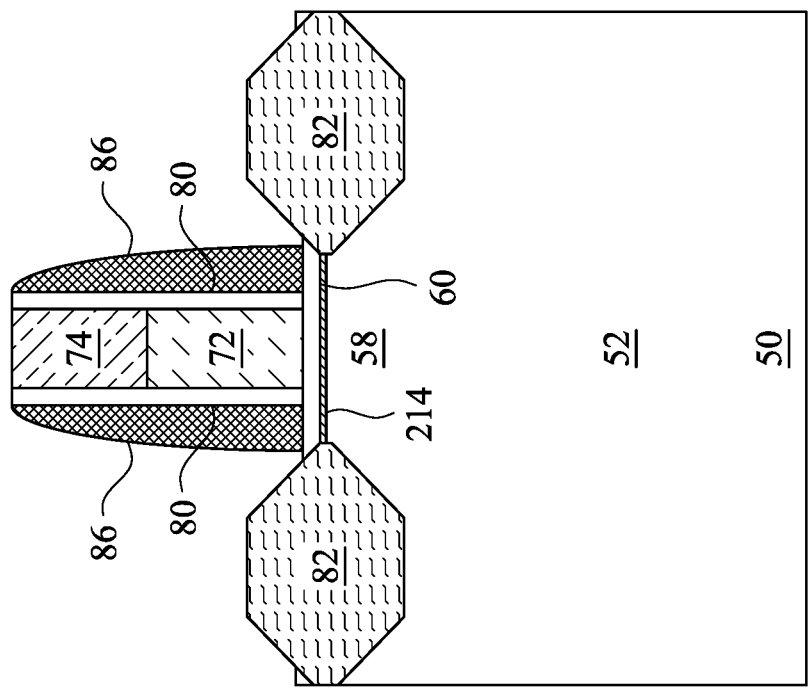
Figure 16A:
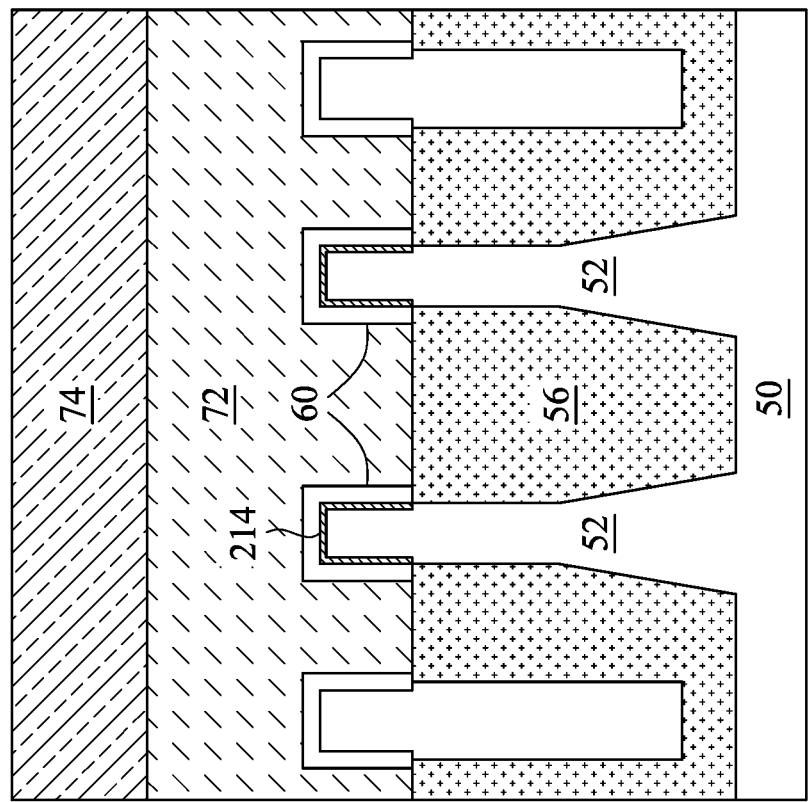
Figure 16D:
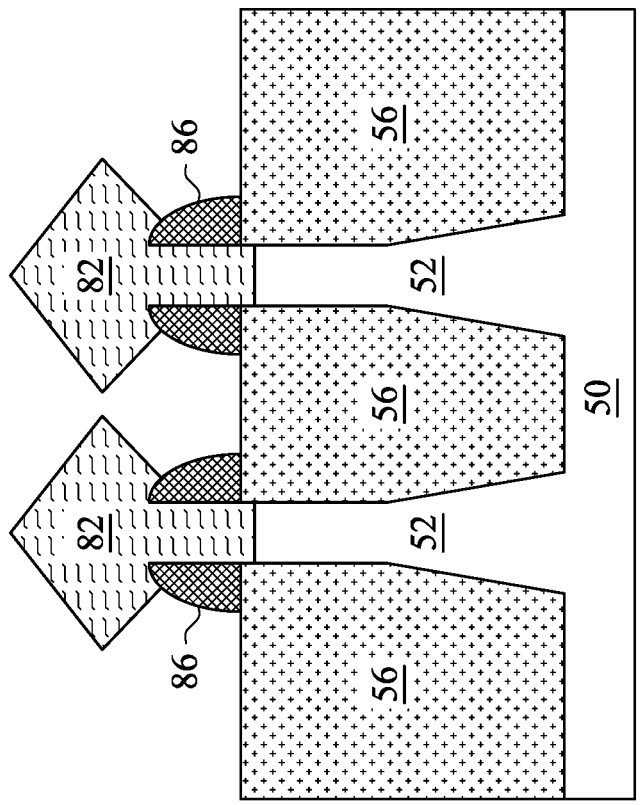
Figure 16C:
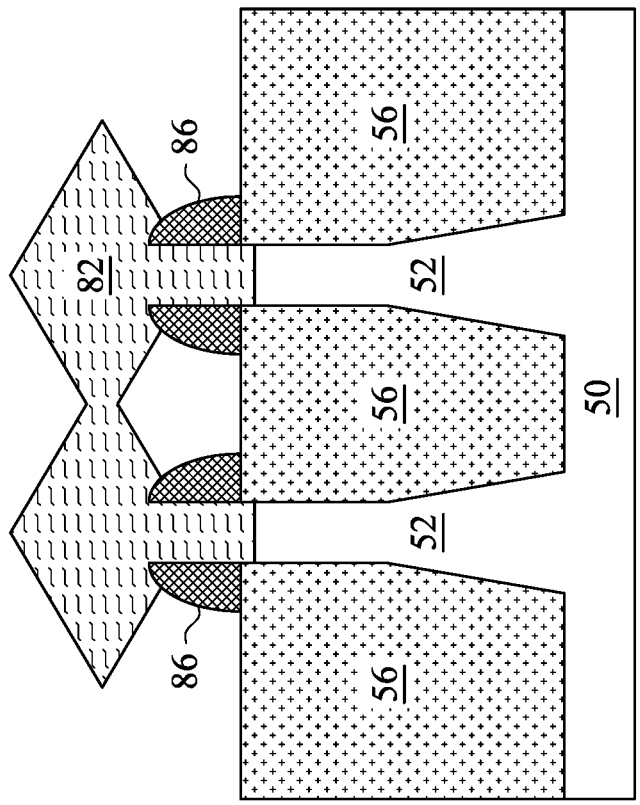

In FIGS. 16A and 16B epitaxial source/drain regions 82 are formed in the fins 52. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 in the n-type region 50N may be formed by masking the p-type region 50P and etching source/drain regions of the fins 52 in the n-type region 50N to form recesses in the fins 52. Then, the epitaxial source/drain regions 82 in the n-type region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorous doped silicon carbide, silicon phosphide, or the like. The epitaxial source/drain regions 82 in the n-type region 50N may have surfaces raised from respective surfaces of the fins 52 and may have facets.

The epitaxial source/drain regions 82 in the p-type region 50P may be formed by masking the n-type region 50N and etching source/drain regions of the fins 52 in the p-type region 50P to form recesses in the fins 52. Then, the epitaxial source/drain regions 82 in the p-type region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon-germanium, boron doped silicon-germanium, germanium, germanium tin, or the like. The epitaxial source/drain regions 82 in the p-type region 50P may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the n-type region 50N and the p-type region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 16C. In other embodiments, adjacent source/drain regions 82 remain separated after the epitaxy process is completed as illustrated by FIG. 16D. In the embodiments illustrated in FIGS. 16C and 16D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56. Notably, the etching of the fins 52 prior to growing the epitaxial source/drain regions 82 may include removal of the dummy dielectric layer 60 and remaining capping layer 214 over those portions of the fins 52. As such, portions of the epitaxial source/drain regions 82 formed over the fins 52 and proximal to the STI regions 56 may extend directly over the STI regions 56 by the extension $E_3$ as discussed above in connection with FIG. 12 (e.g., the dummy dielectric layer 60 extending directly over the STI regions 56). In addition, portions of the epitaxial source/drain regions 82 formed over the fins 204 and proximal to the STI regions 56 may extend directly over the STI regions 56 by the extension $E_4$ also as discussed above in connection with FIG. 12.

Figure 17B:
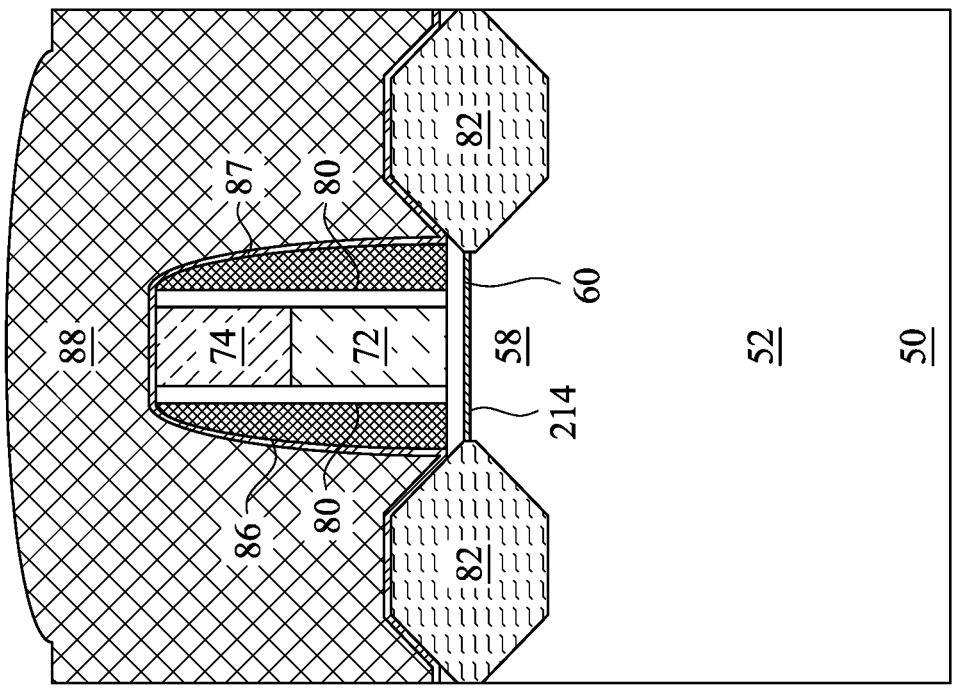
Figure 17A:
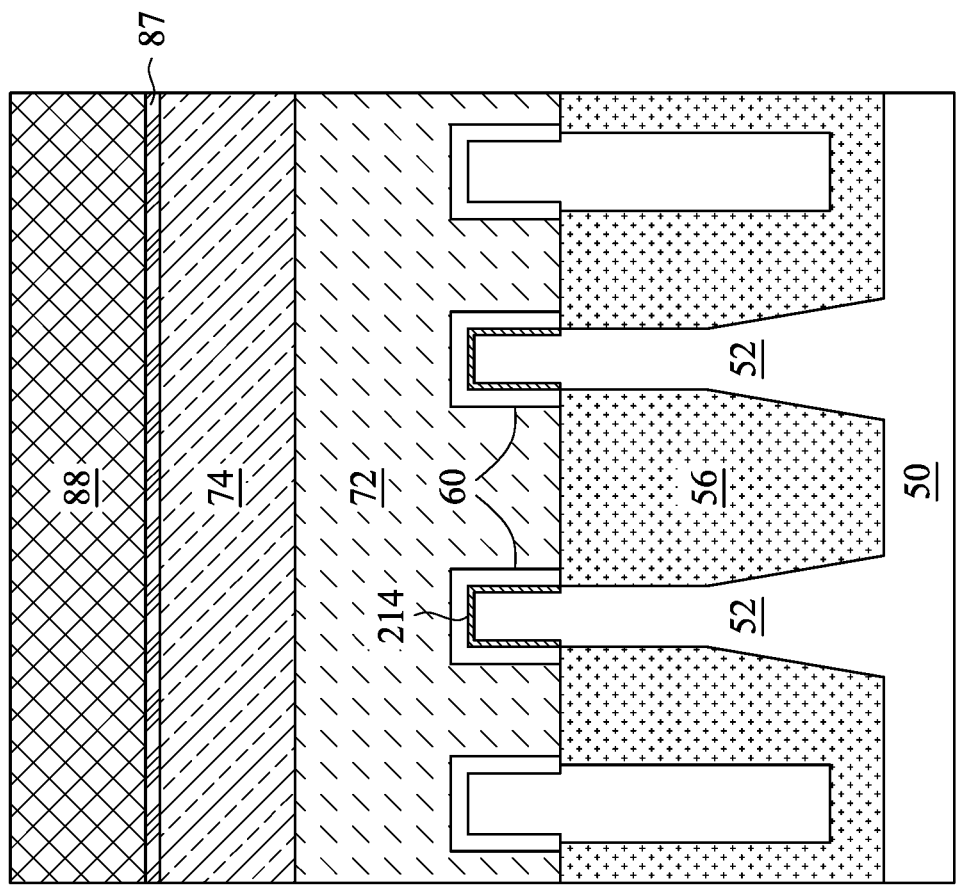

In FIGS. 17A and 17B, a first interlayer dielectric (ILD) 88 is deposited over the structure illustrated in FIGS. 16A and 16B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

Figure 18B:
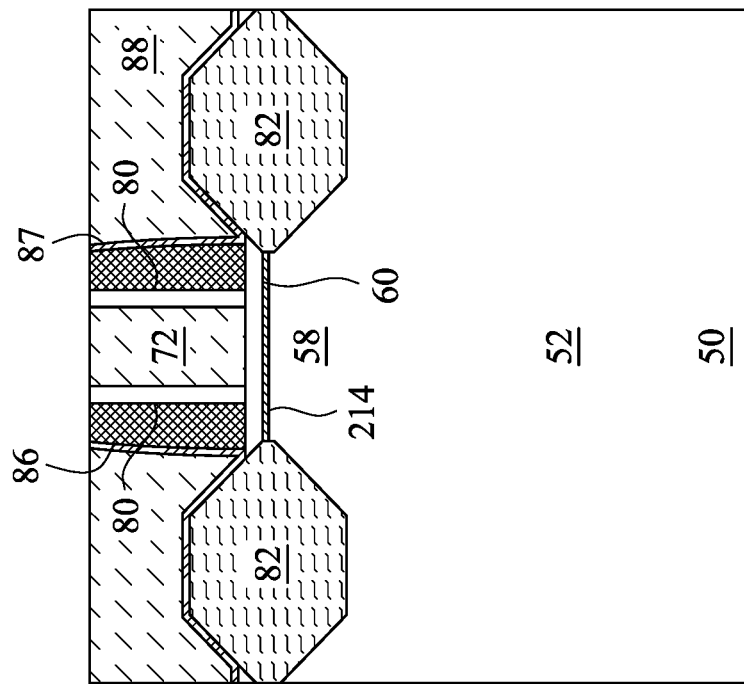
Figure 18A:
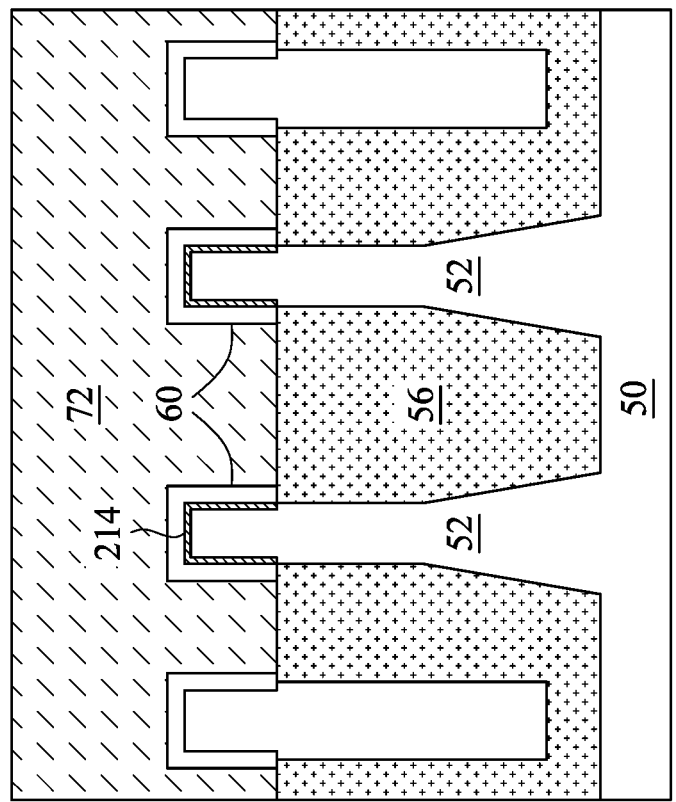

In FIGS. 18A and 18B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

Figure 19B:
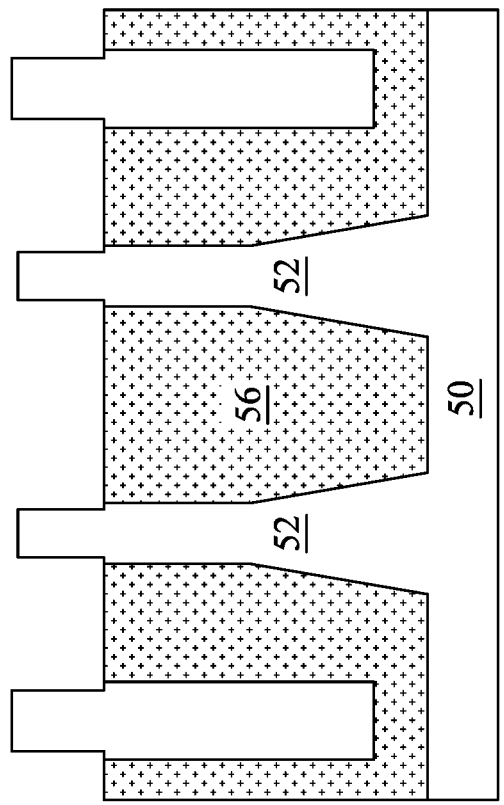
Figure 19A:
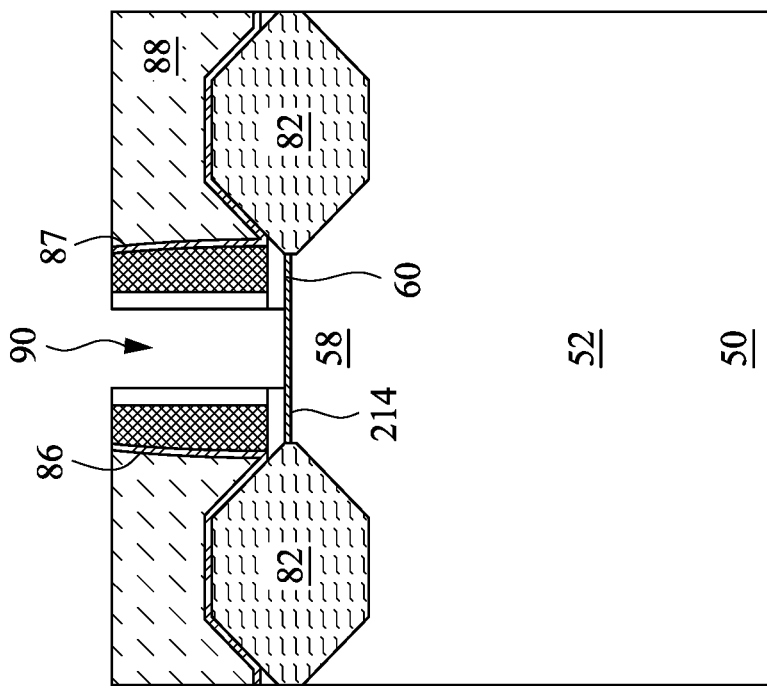

In FIGS. 19A and 19B, the dummy gates 72, and the masks 74 if present, are removed in an etching step(s), so that recesses 90 are formed. Portions of the dummy dielectric layer 60 in the recesses 90 may also be removed. And to the extent portions of the capping layer 214 in the recesses 90 and over the fins 52 (or the fins 204, which are not specifically illustrated) remain, those exposed portions of the capping layer 214 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 20B:
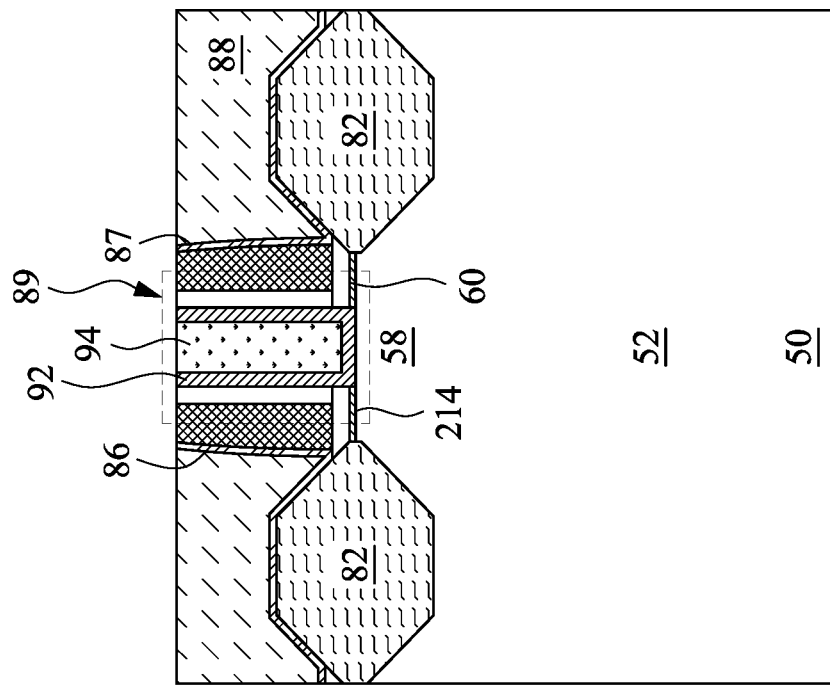
Figure 20A:
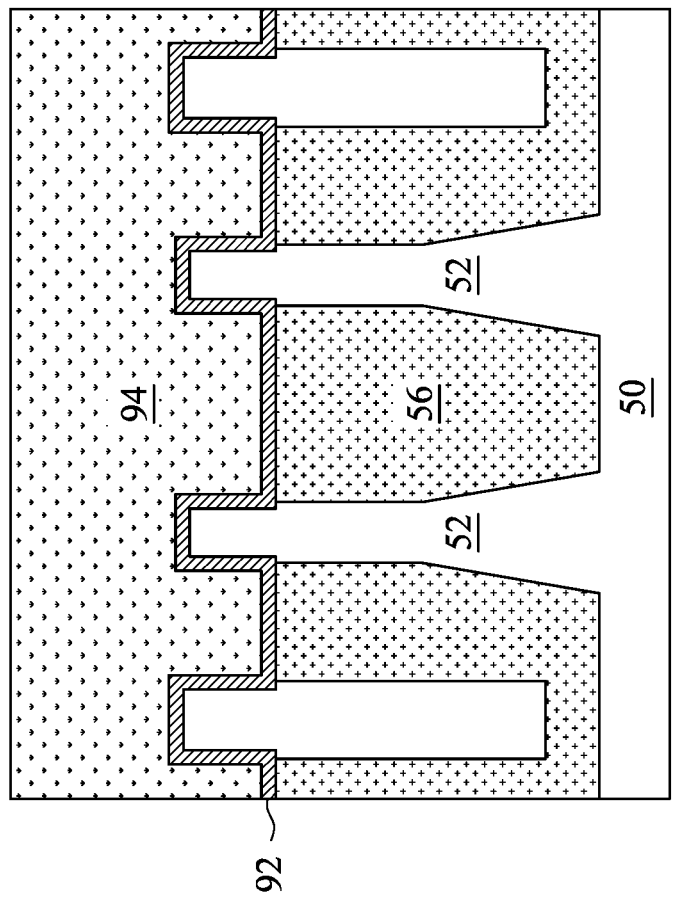
Figure 20C:
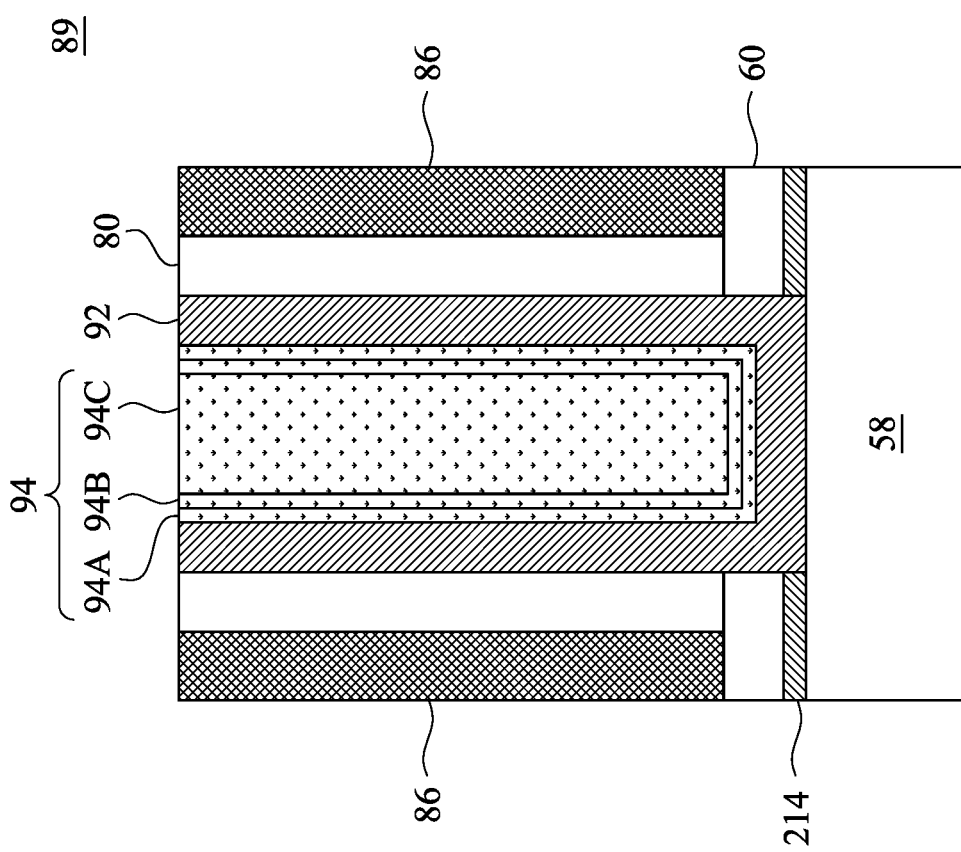

In FIGS. 20A and 20B, gate dielectric layers 92 and gate electrodes 94 are formed for replacement gates. FIG. 20C illustrates a detailed view of region 89 of FIG. 20B. Gate dielectric layers 92 one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy dielectric layer 60 remains in the recesses 90, the gate dielectric layers 92 include a material of the dummy dielectric layer 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 20B, the gate electrode 94 may comprise any number of liner layers 94A, any number of work function tuning layers 94B, and a fill material 94C as illustrated by FIG. 20C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52. As noted above, due to maintaining greater spatial displacements between adjacent fins (e.g., spatial displacements $S_5$ and $S_6$) during formation of the capping layer 212, the gate dielectric layers 92 and the gate electrodes 94 may be formed with greater efficiency and with fewer or no voids.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 21B:
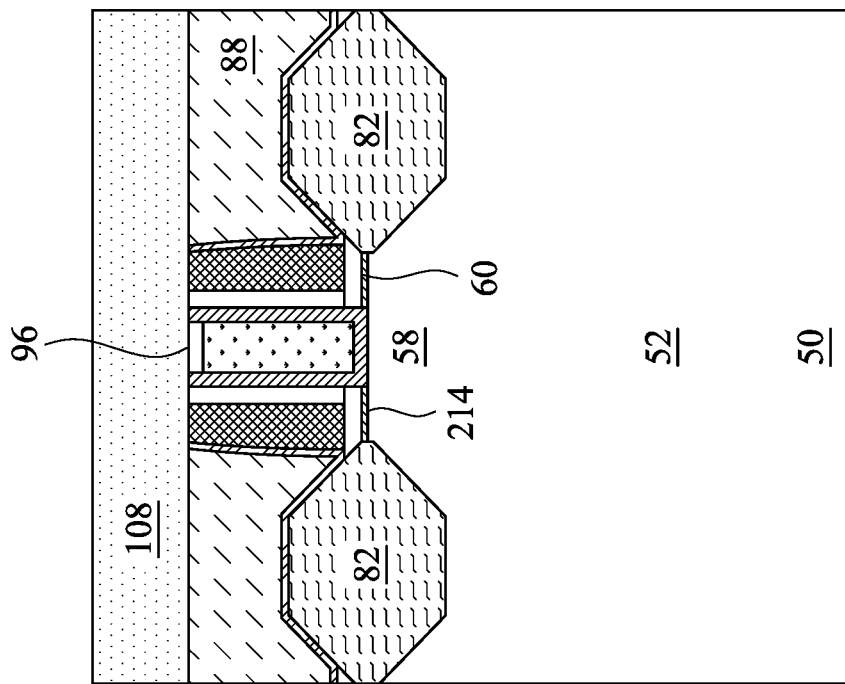
Figure 21A:
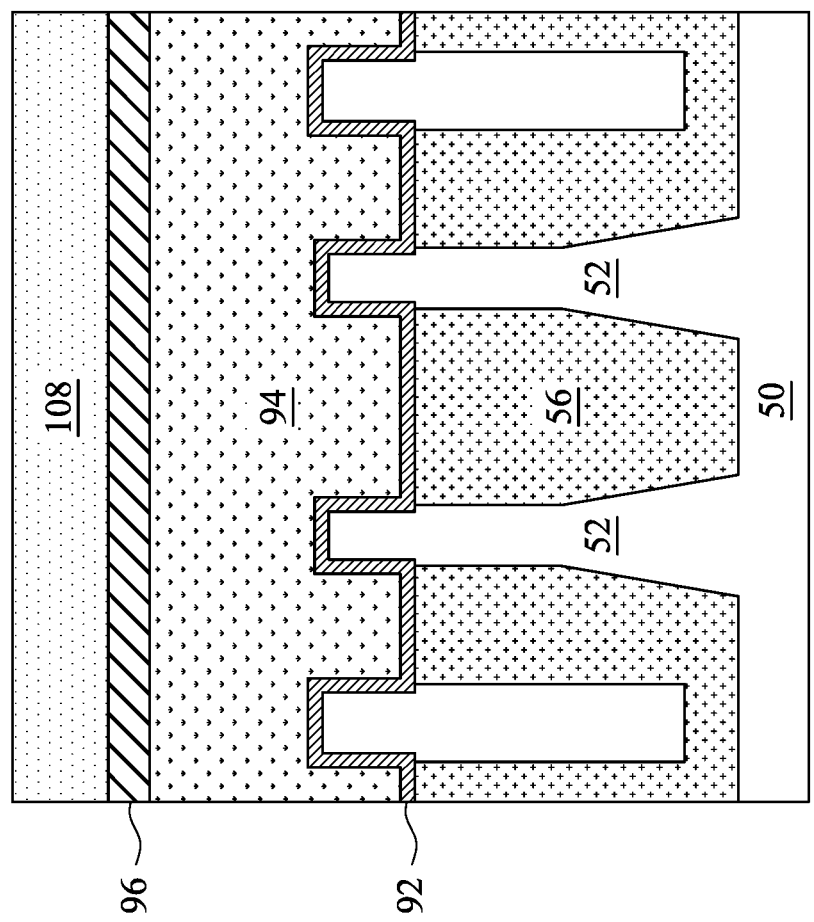

In FIGS. 21A and 21B, a gate mask 96 is formed over the gate stack (including a gate dielectric layer 92 and a corresponding gate electrode 94), and the gate mask may be disposed between opposing portions of the gate spacers 86. In some embodiments, forming the gate mask 96 includes recessing the gate stack so that a recess is formed directly over the gate stack and between opposing portions of gate spacers 86. A gate mask 96 comprising one or more layers of dielectric material, such as silicon nitride, silicon oxynitride, or the like, is filled in the recess, followed by a planarization process to remove excess portions of the dielectric material extending over the first ILD 88.

As also illustrated in FIGS. 21A and 21B, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed gate contacts 110 (see FIGS. 22A and 22B) penetrate through the second ILD 108 and the gate mask 96 to contact the top surface of the recessed gate electrode 94.

Figure 22B:
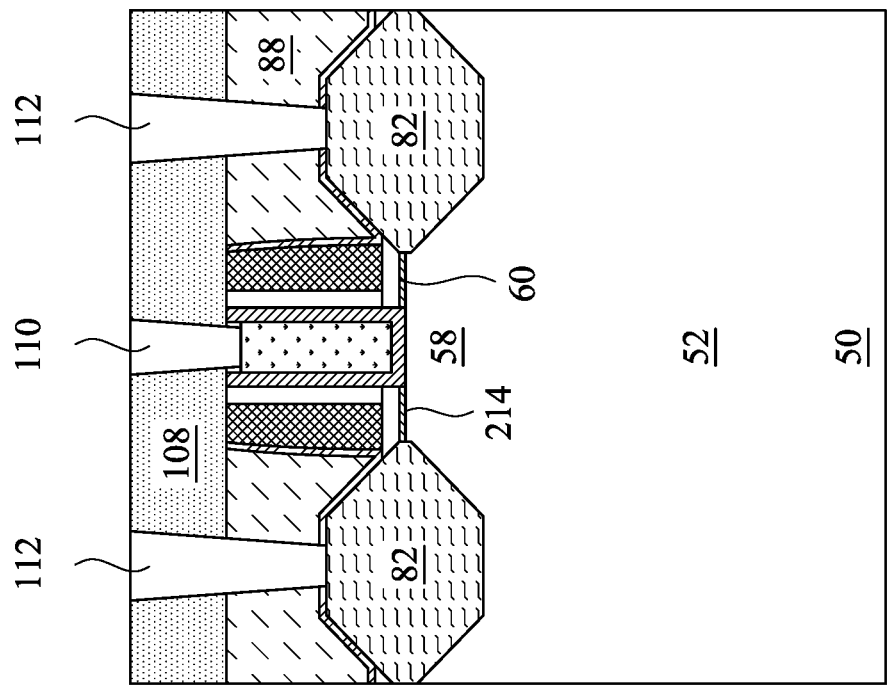
Figure 22A:
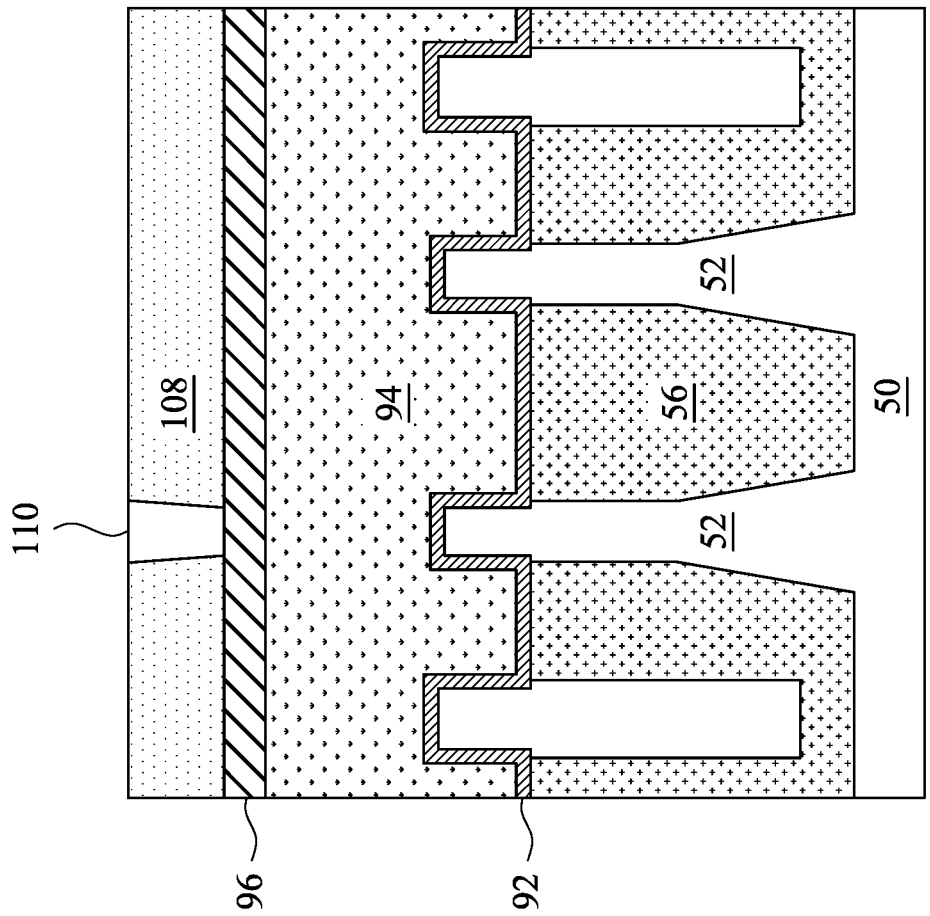

In FIGS. 22A and 22B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96. The openings may be formed using acceptable photolithography and etching techniques. A liner (not specifically illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 94. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

FIGS. 23A through 25C are additional cross-sectional views of the processes described above in connection with FIGS. 10 through 12, in accordance with some embodiments. The disclosed processes achieve benefits of adjusting the spatial displacement between various arrangements of adjacent fins (e.g., the fins 52, the fins 204, the dummy fins 206). Controlling the various spatial displacements may improve yield and effectiveness of subsequent processes, such as forming the dummy gate layer 62 and/or the gate electrodes 94 efficiently and without voids.

Figure 23B:
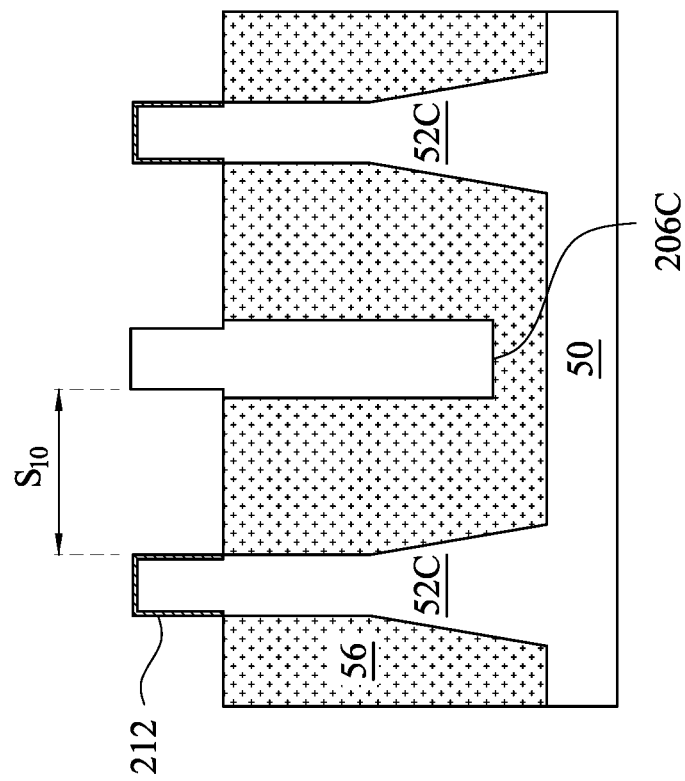
Figure 23A:
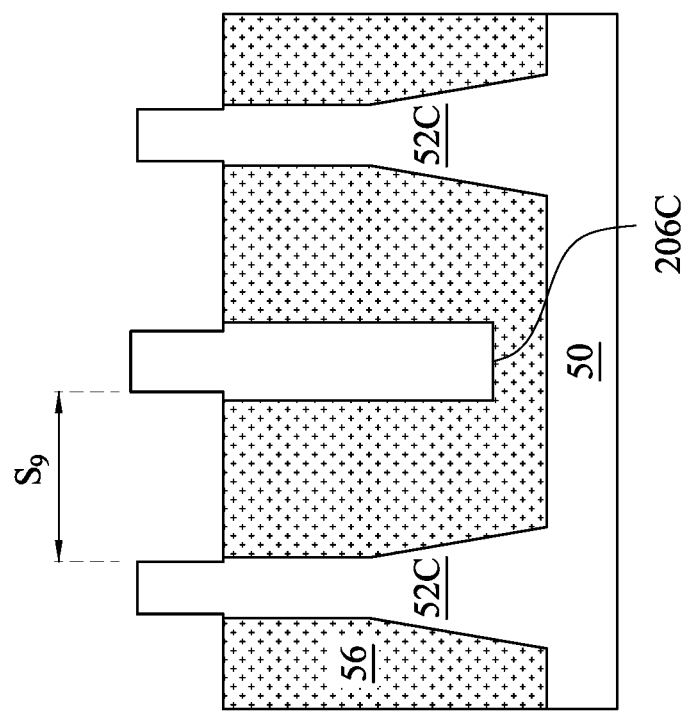
Figure 23C:
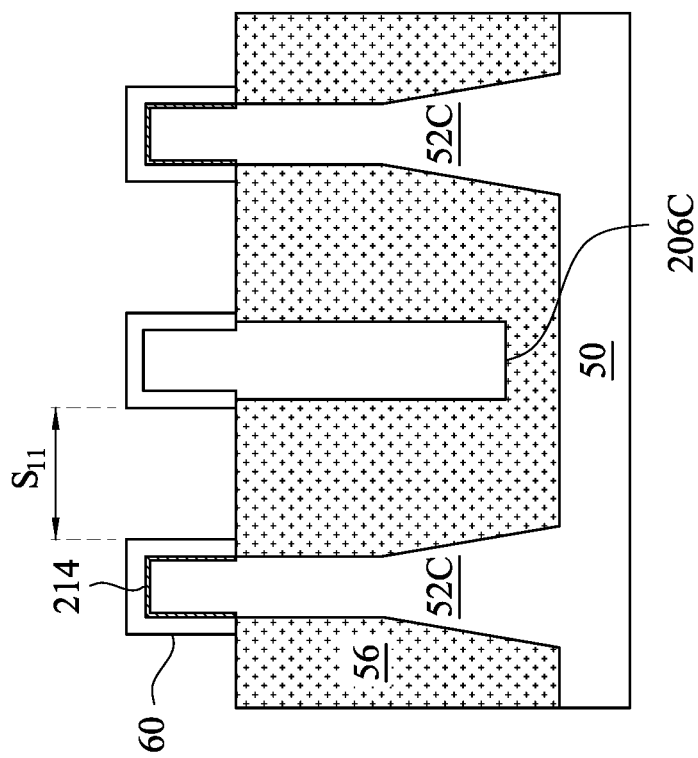

Referring to FIGS. 23A through 23C, in some embodiments, a dummy fin 206C may be interposed between two fins 52C. Referring to FIG. 23A, after the trimming step described above in connection with FIG. 10, the dummy fin 206C may have a spatial displacement $S_9$ from one of the fins 52C of between about 15 nm and about 60 nm. Referring to FIG. 23B, after forming the capping layer 212 described above in connection with FIG. 11A, the dummy fin 206C may have a spatial displacement $S_{10}$ from one of the fins 52C (and its corresponding portion of the capping layer 212) of between about 13.5 nm and about 60 nm. Referring to FIG. 23C, after forming the dummy dielectric layer 60 described above in connection with FIG. 12, the dummy fin 206C may have a spatial displacement $S_{11}$ from one of the fins 52C (and its corresponding portion of the dummy dielectric layer 60 and remaining capping layer 214) of between about 3 nm and about 50 nm.

Figure 24A:
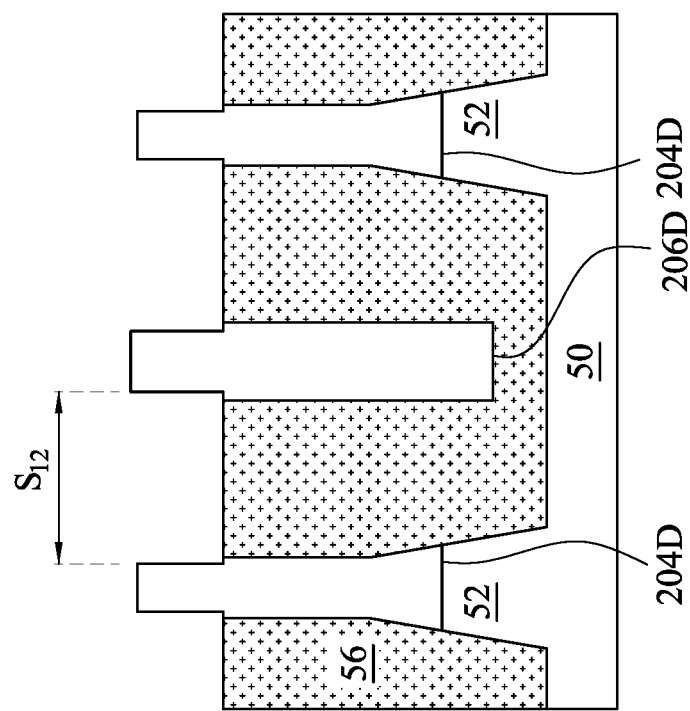
Figure 24B:
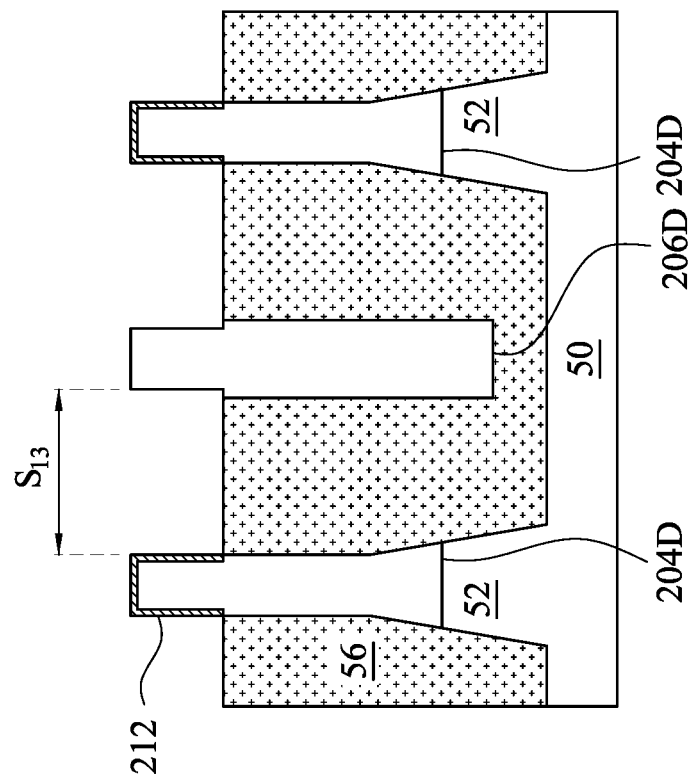
Figure 24C:
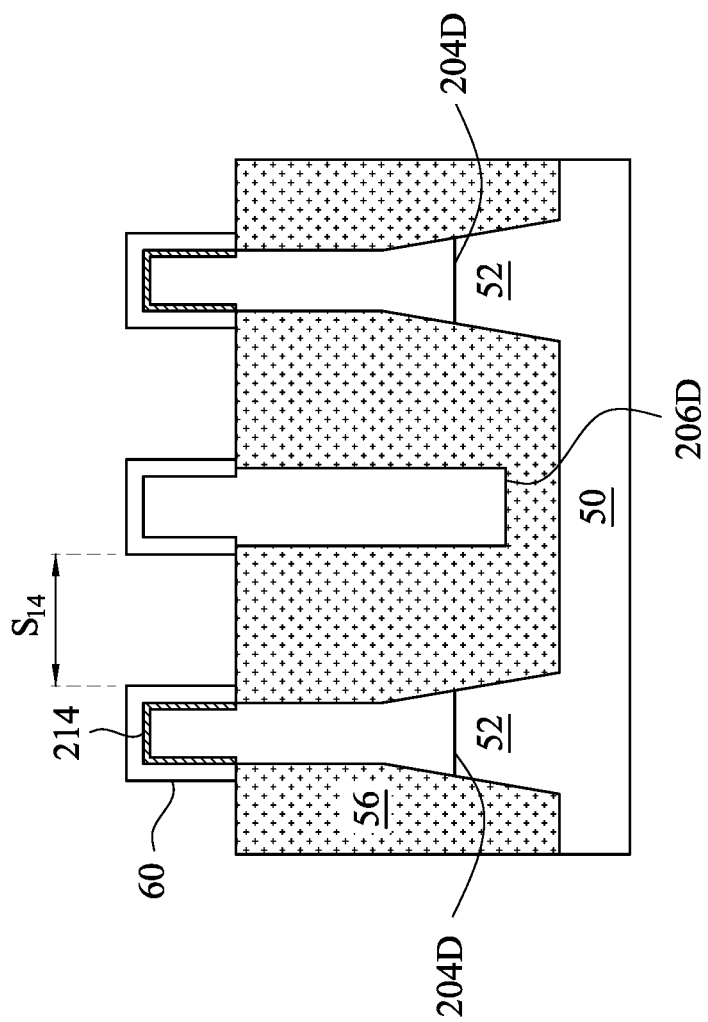

Referring to FIGS. 24A through 24C, in the same or other embodiments, a dummy fin 206D may be interposed between two fins 204D. Referring to FIG. 24A, after the trimming step (see FIG. 10), the dummy fin 206D may have a spatial displacement $S_{12}$ from one of the fins 204D of between about 15 nm and about 60 nm. Referring to FIG. 24B, after forming the capping layer 212 (see FIG. 11A), the dummy fin 206D may have a spatial displacement $S_{13}$ from one of the fins 204D (and its corresponding portion of the capping layer 212) of between about 12 nm and about 57 nm. Referring to FIG. 24C, after forming the dummy dielectric layer 60 (see FIG. 12), the dummy fin 206D may have a spatial displacement $S_{14}$ from one of the fins 204D (and its corresponding portion of the dummy dielectric layer 60 and remaining capping layer 214) of between about 2 nm and about 47 nm.

Figure 25B:
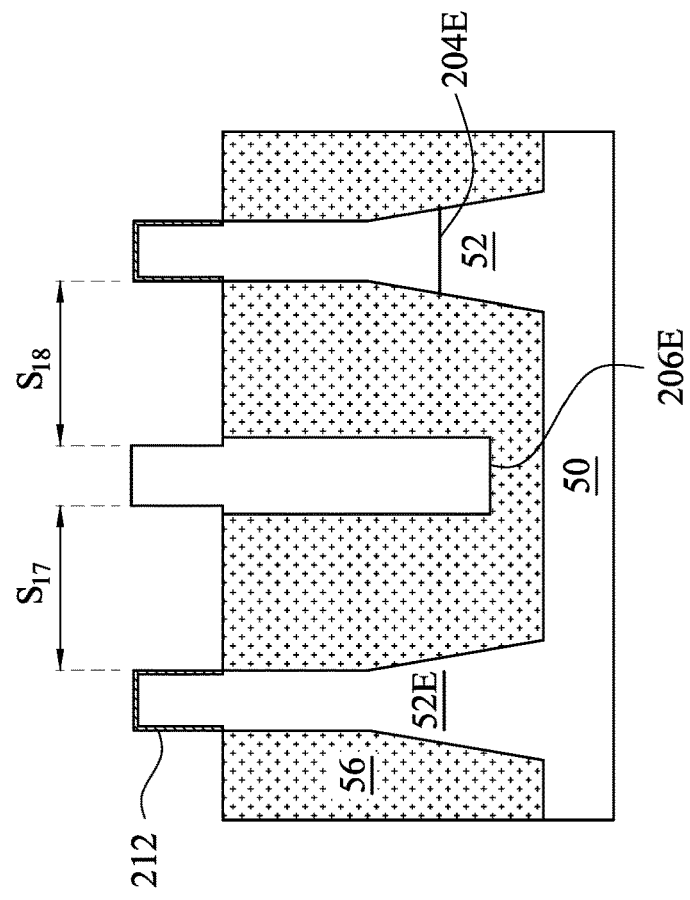
Figure 25A:
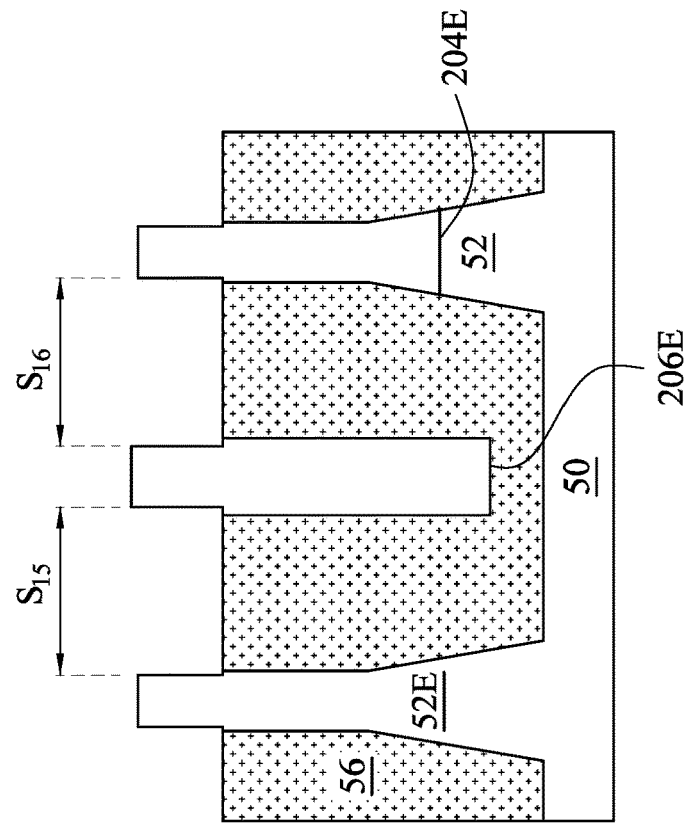
Figure 25C:
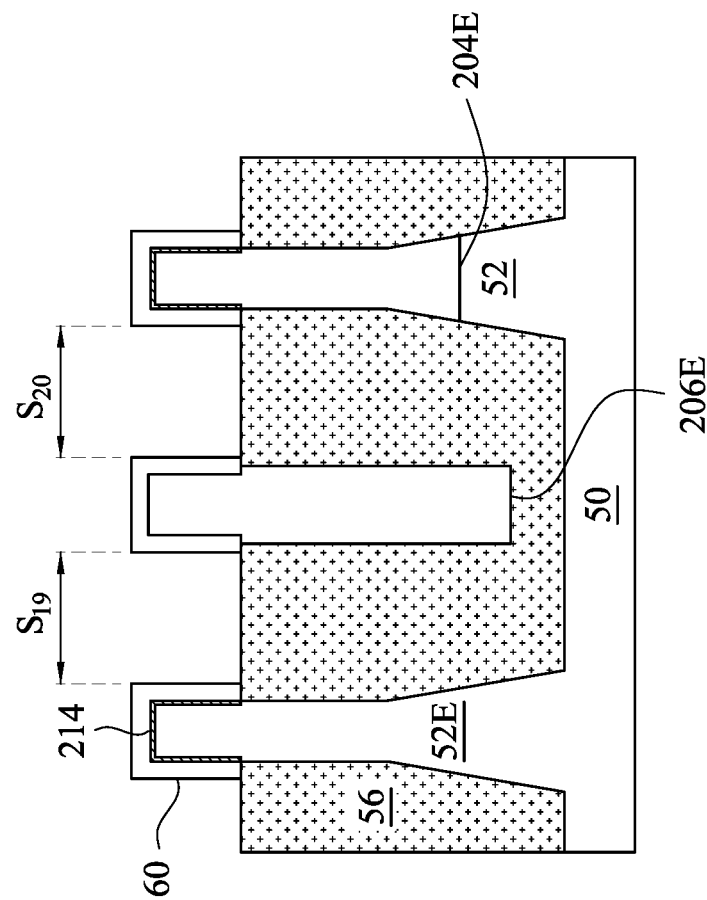

Referring to FIGS. 25A through 25C, in the same or other embodiments, a dummy fin 206E may be interposed between a fin 52E and a fin 204E. Referring to FIG. 25A, after the trimming step (see FIG. 10), the dummy fin 206E may have a spatial displacement $S_{15}$ from the fin 52E of between about 15 nm and about 60 nm and a spatial displacement $S_{16}$ from the fin 204E of between about 15 nm and about 60 nm. Referring to FIG. 25B, after forming the capping layer 212 (see FIG. 11A), the dummy fin 206E may have a spatial displacement $S_{17}$ from the fin 52E (and its corresponding portion of the capping layer 212) of between about 13.5 nm and about 60 nm and a spatial displacement $S_{18}$ from the fin 204E (and its corresponding portion of the capping layer 212) of between about 12 nm and about 57 nm. Referring to FIG. 25C, after forming the dummy dielectric layer 60 (see FIG. 12), the dummy fin 206E may have a spatial displacement $S_{19}$ from the fin 52E (and its corresponding portion of the dummy dielectric layer 60 and remaining capping layer 214) of between about 3 nm and about 50 nm and a spatial displacement $S_{20}$ from the fin 204E (and its corresponding portion of the dummy dielectric layer 60 and remaining capping layer 214) of between about 2 nm and about 47 nm.

Further, it should be noted that the widths of the various fins in the foregoing embodiments after performing each step may be the same or similar as those described above in connection with FIGS. 10 through 12. The same should be noted with respect to thickness losses of the fins, extensions of the layers (e.g., the capping layer 212 and/or the dummy dielectric layer 60) directly over the STI regions 56, and relationships of any of these parameters as described above.

The disclosed embodiments achieve advantages. Forming a capping layer 212 over the semiconductor fins (e.g., the fins 52 and the fins 204) serves to protect the semiconductor fins from oxidation during subsequent processing steps while also preventing or reducing out-diffusion of certain elements, such as germanium in the case of silicon-germanium fins, into nearby features of the semiconductor device. The capping layer 212 may be formed in such a way that provides multiple additional benefits. First, the method of forming the capping layer 212 may provide greater control over the size and shape of the semiconductor fins. For example, trimming processes performed on the semiconductor fins may etch some fins (e.g., silicon-germanium fins) to a greater degree than other fins (e.g., silicon fins). By forming the capping layer as disclosed above, the capping layer may be formed with a faster growth rate over, for example, the silicon-germanium fins as compared to the silicon fins. As a result, the silicon-germanium fins (with corresponding capping layer 212) may have a size and shape that is similar to or the same as that of the silicon fins. Compatible sizes of each type of semiconductor fin serves to improve effectiveness and consistency during subsequent processing steps. Second, the method of forming the capping layer 212 may control the spatial displacement (e.g. a distance of the opening) between a semiconductor fin and an adjacent dummy dielectric fin. For example, by forming the capping layer 212 as disclosed above, the capping layer 212 may be formed selectively and continuously over the semiconductor fins while forming only discrete or discontinuous nodules (e.g., amorphous clusters) over the dummy dielectric fins. By limiting the thicknesses of layers formed over the dummy dielectric fins, the structure retains a sufficient spatial displacement between semiconductor fins and the dummy dielectric fins such that subsequent depositions of layers, such as the dummy gate layer 62 and/or the gate electrode 94, may be formed efficiently and without voids.

In an embodiment, a method includes forming a first fin and a second fin within an insulation material over a substrate, the first fin and the second fin includes different materials, the insulation material being interposed between the first fin and the second fin, the first fin having a first width and the second fin having a second width; forming a first capping layer over the first fin; and forming a second capping layer over the second fin, the first capping layer having a first thickness, the second capping layer having a second thickness different from the first thickness. In another embodiment, the forming the first capping layer and the forming the second capping layer are performed simultaneously. In another embodiment, the first fin includes silicon, and wherein the second fin includes silicon-germanium. In another embodiment, the second thickness is greater than the first thickness. In another embodiment, the method further includes, after forming the first fin and the second fin, trimming the first fin and the second fin. In another embodiment, after trimming the first fin and the second fin, the first fin has a third width and the second fin has a fourth width, and wherein a difference between the fourth width and the second width is greater than a difference between the third width and the first width. In another embodiment, after forming the first capping layer and the second capping layer, the first fin and the first capping layer have a fifth width and the second fin and the second capping layer have a sixth width, and wherein the fifth width is the same as the sixth width. In another embodiment, the method further includes forming a first dielectric layer over the first capping layer and a second dielectric layer over the second capping layer, wherein forming the first dielectric layer includes converting an upper portion of the first capping layer to a first intermediate layer, and wherein forming the second dielectric layer includes converting an upper portion of the second capping layer to a second intermediate layer.

In an embodiment, a method includes forming a structure includes a plurality of fins within a dielectric material over a substrate, the plurality of fins includes a first fin, a second fin, a first dummy fin, and a second dummy fin; forming isolation regions from the dielectric material between each of the plurality of fins, the first fin and the first dummy fin being separated by a first opening, the second fin and the second dummy fin being separated by a second opening; expanding the first opening and expanding the second opening; performing a first reduction of the first opening and the second opening, wherein the first reduction includes forming a first capping layer over the first fin and a second capping layer over the second fin, wherein a thickness of the first capping layer is lesser than a thickness of the second capping layer; performing a second reduction of the first opening and the second opening, wherein the second reduction includes forming a first dielectric layer over the first capping layer, a first dummy dielectric layer over the first dummy fin, a second dielectric layer over the second capping layer, and a second dummy dielectric layer over the second dummy fin, wherein a combined thickness of the first capping layer and the first dielectric layer is greater than a thickness of the first dummy dielectric layer; and forming gate structures over the first fin and the second fin. In another embodiment, a first amount of the expanding the first opening is lesser than a second amount of the expanding the second opening. In another embodiment, a difference between the thickness of the first capping layer and the first amount is the same as a difference between the thickness of the second capping layer and the second amount. In another embodiment, forming the first dielectric layer includes forming a first partial layer and converting a portion of the first capping layer to a first intermediate layer, and wherein forming the second dielectric layer includes forming a second partial layer and converting a portion of the second capping layer to a second intermediate layer. In another embodiment, after forming the first dielectric layer and the second dielectric layer, the first dielectric layer physically contacts the first fin. In another embodiment, after forming the first capping layer and the second capping layer, a portion of the first capping layer extends directly over a first of the isolation regions by a first extension distance, and a portion of the second capping layer extends directly over a second of the isolation regions by a second extension distance, the first extension distance being greater than the second extension distance. In another embodiment, forming the first capping layer and the second capping layer further includes forming discontinuous nodules directly on the first dummy fin and the second dummy fin.

In an embodiment, a semiconductor device includes a first fin and a second fin disposed adjacent to a substrate, a first isolation region interposed between the first fin and the second fin; a third fin and a fourth fin disposed adjacent to the substrate, a second isolation region interposed between the third fin and the fourth fin, the third fin and the fourth fin includes silicon-germanium; a first semiconductor layer disposed adjacent to the first fin and the second fin, the first semiconductor layer being a same composition as the first fin and the second fin, the first semiconductor layer physically contacting the first isolation region; and a second semiconductor layer disposed adjacent to the third fin and the fourth fin, the second semiconductor layer includes silicon-germanium, the second semiconductor layer physically contacting the second isolation region. In another embodiment, the first semiconductor layer includes a first crystalline structure, and wherein the second semiconductor layer includes a second crystalline structure. In another embodiment, the first crystalline structure includes a same crystallinearity as the first fin and the second fin. In another embodiment, the second crystalline structure includes a same crystallinearity as the third fin and the fourth fin. In another embodiment, a first portion of the second semiconductor layer proximal to the third fin and the fourth fin has a greater germanium concentration than a second portion of the second semiconductor layer distal from the third fin and the fourth fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first fin and a second fin disposed adjacent to a substrate, each of the first fin and the second fin being silicon;
   a first isolation region interposed between the first fin and the second fin;
   a third fin and a fourth fin disposed adjacent to the substrate, each of the third fin and the fourth fin being silicon-germanium;
   a second isolation region interposed between the third fin and the fourth fin;
   a first semiconductor layer disposed along the first fin and the second fin, the first semiconductor layer being a same composition as the first fin and the second fin, the first semiconductor layer physically contacting the first isolation region;
   a first gate dielectric disposed over the first semiconductor layer;
   a first gate disposed over the first gate dielectric;
   a second semiconductor layer disposed adjacent to the third fin and the fourth fin, the second semiconductor layer comprising silicon-germanium, the second semiconductor layer physically contacting the second isolation region;
   a second gate dielectric disposed over the second semiconductor layer; and
   a second gate disposed over the second gate dielectric.

2. The semiconductor device of claim 1, wherein the first semiconductor layer comprises a first crystalline structure, and wherein the second semiconductor layer comprises a second crystalline structure.

3. The semiconductor device of claim 2, wherein the first crystalline structure comprises a same crystallinearity as the first fin and the second fin.

4. The semiconductor device of claim 2, wherein the second crystalline structure comprises a same crystallinearity as the third fin and the fourth fin.

5. The semiconductor device of claim 1, wherein a first portion of the second semiconductor layer proximal to the third fin and the fourth fin has a greater germanium concentration than a second portion of the second semiconductor layer distal from the third fin and the fourth fin.

6. The semiconductor device of claim 1, wherein a first thickness of the first semiconductor layer is less than a second thickness of the second semiconductor layer.

7. The semiconductor device of claim 1, wherein the first gate dielectric comprises a first dielectric bi-layer, the first dielectric bi-layer comprising:
   a first silicon oxide layer along the first semiconductor layer; and
   a second silicon oxide layer over the first silicon oxide layer, the second silicon oxide layer comprising a greater oxygen concentration than the first silicon oxide layer.

8. The semiconductor device of claim 1, wherein the first gate comprises polysilicon, and wherein the second gate comprises polysilicon.

9. A semiconductor device, comprising:
   a silicon fin over a substrate;
   a first isolation region over the substrate and adjacent to the silicon fin;
   a silicon-germanium fin over the substrate;

a second isolation region over the substrate and adjacent to the silicon-germanium fin;
a first gate stack over a first top surface of the silicon fin;
a first semiconductor layer over the first top surface and adjacent to the first gate stack;
a first source/drain region embedded in the silicon fin, the first semiconductor layer being interposed between the first gate stack and the first source/drain region;
a second gate stack over a second top surface of the silicon-germanium fin;
a second semiconductor layer over the second top surface and adjacent to the second gate stack, the first semiconductor layer and the second semiconductor layer having different crystallinearities; and
a second source/drain region embedded in the silicon-germanium fin, the second semiconductor layer being interposed between the second gate stack and the second source/drain region.

10. The semiconductor device of claim 9, wherein the first semiconductor layer is silicon.

11. The semiconductor device of claim 10, wherein the second semiconductor layer is silicon.

12. The semiconductor device of claim 9, wherein a thickness of the first semiconductor layer is less than a thickness of the second semiconductor layer.

13. The semiconductor device of claim 9, further comprising:
a first gate spacer over the first semiconductor layer, the first gate spacer interposed between the first gate stack and the first source/drain region;
a first silicon oxide layer interposed between the first semiconductor layer and the first gate spacer;
a second gate spacer over the second semiconductor layer, the second gate spacer interposed between the second gate stack and the second source/drain region; and
a second silicon oxide layer interposed between the second semiconductor layer and the second gate spacer.

14. The semiconductor device of claim 13, wherein a sum of thicknesses of the first semiconductor layer and the first silicon oxide layer is less than a sum of thicknesses of the second semiconductor layer and the second silicon oxide layer.

15. A semiconductor device, comprising:
a first isolation region and a second isolation region over a semiconductor substrate;
a first fin over the semiconductor substrate, each of the first fin and the semiconductor substrate comprising a first semiconductor material, the first fin comprising a first lower portion below a top surface of the first isolation region, the first fin comprising a first upper portion above the top surface of the first isolation region, a width of the first lower portion being greater than a width of the first upper portion;
a partial fin over the semiconductor substrate, the partial fin comprising the first semiconductor material;
a second fin over the partial fin, the second fin comprising a second semiconductor material, the second semiconductor material being different from the first semiconductor material, the second fin comprising a second lower portion below a top surface of the second isolation region, the second fin comprising a second upper portion above the top surface of the second isolation region, a width of the second lower portion being greater than a width of the second upper portion;
a first capping layer along the first upper portion of the first fin, the first capping layer comprising the first semiconductor material;
a second capping layer along the second upper portion of the second fin, the second capping layer comprising the first semiconductor material, the second capping layer having a greater thickness than the first capping layer;
a first gate oxide layer over the first capping layer; and
a second gate oxide layer over the second capping layer.

16. The semiconductor device of claim 15, wherein the first gate oxide layer has a same thickness as the second gate oxide layer.

17. The semiconductor device of claim 15, wherein the first gate oxide layer overhangs and physically contacts the first isolation region, and wherein the second gate oxide layer overhangs and physically contacts the second isolation region.

18. The semiconductor device of claim 15, further comprising:
a first gate electrode over the first gate oxide layer; and
a second gate electrode over the second gate oxide layer.

19. The semiconductor device of claim 15, wherein the first gate oxide layer comprises a lower layer and an upper layer, and wherein the upper layer has a greater oxygen concentration than the lower layer.

20. The semiconductor device of claim 15, further comprising a dielectric fin over the semiconductor substrate and embedded within the first isolation region, and wherein the first isolation region is directly interposed between the first fin and the second fin.

* * * * *